(12) United States Patent
Satsuki et al.

(10) Patent No.: US 7,338,720 B2
(45) Date of Patent: *Mar. 4, 2008

(54) ORGANIC ELECTROLUMINESCENT ELEMENT

(75) Inventors: Makoto Satsuki, Okayama (JP);
Natsuko Ishida, Okayama (JP);
Sadaharu Suga, Okayama (JP);
Hisayoshi Fujikawa, Aichi (JP);
Yasunori Taga, Aichi (JP); Satoshi Nakagawa, Aichi (JP); Takanori Murasaki, Aichi (JP); Yoshifumi Kato, Aichi (JP)

(73) Assignee: Kabushiki Kaisha Toyota Jidoshokki, Aichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/505,099

(22) PCT Filed: Apr. 23, 2002

(86) PCT No.: PCT/JP02/04044

§ 371 (c)(1),
(2), (4) Date: Aug. 19, 2004

(87) PCT Pub. No.: WO03/070855

PCT Pub. Date: Aug. 28, 2003

(65) Prior Publication Data

US 2005/0089713 A1    Apr. 28, 2005

(30) Foreign Application Priority Data

Feb. 21, 2002   (JP)   ............................... 2002-045342

(51) Int. Cl.
*C09K 11/06*   (2006.01)

(52) U.S. Cl. ...................... 428/690; 428/917; 313/504; 313/506; 252/301.16; 548/120; 548/150; 548/218; 548/302.1; 548/427; 549/275

(58) Field of Classification Search ................ 428/690, 428/917; 313/504, 506; 252/301.16; 548/120, 548/150, 218, 302.1, 427; 257/40; 549/275, 549/287

See application file for complete search history.

(56) References Cited

U.S. PATENT DOCUMENTS

| 4,769,292 | A  | * | 9/1988 | Tang et al. ................. 428/690 |
| 6,440,586 | B1 | * | 8/2002 | Yanagi et al. ............... 428/690 |
| 6,573,380 | B2 | * | 6/2003 | Taniguchi et al. ............ 546/71 |
| 2005/0089713 | A1 | * | 4/2005 | Satsuki et al. .............. 428/690 |

FOREIGN PATENT DOCUMENTS

| EP | 1010742      |   | 6/2000  |
| EP | 1 041 074 A  |   | 10/2000 |
| JP | 2001-76876   |   | 3/2001  |
| JP | 2001-076876  | * | 3/2001  |
| JP | 2002-47291   |   | 2/2002  |
| JP | 2002-226484  |   | 8/2002  |

* cited by examiner

*Primary Examiner*—Milton I. Cano
*Assistant Examiner*—Camie S. Thompson
(74) *Attorney, Agent, or Firm*—Browdy and Neimark, PLLC

(57) ABSTRACT

An organic electroluminescent (EL) device which uses, as a luminescence-assisting agent, a novel coumarin derivative with a specific structure. The coumarin derivative effectively accelerates in such an organic EL device the transfer of excited energy in a host compound to a guest compound. Thus, the coumarin derivative affords the organic EL device which is superior in a color purity, luminescent efficiency and life expectancy when used in combination with appropriate host and guest compounds.

5 Claims, 2 Drawing Sheets

ORGANIC ELECTROLUMINESCENT ELEMENT

TECHNICAL FIELD

This invention relates to an organic electroluminescent device (abbreviated as "organic EL device" hereinafter), more particularly, to an organic EL device using a novel coumarin derivative.

BACKGROUND ART

In the field of information display, organic EL devices have been highlighted as displaying devices of the forthcoming generation. Hitherto, cathode-ray tubes have been predominantly used in information displaying equipment of larger sizes such as computer termini and TV receivers: However, cathode-ray tubes are large in volume and weight and high in operation voltage, and these may restrict their application in equipment which are directed to use at home, as well as in compact equipment where portability is one of important factors. More required are information displaying equipments which are in a thinner and lighter panel form and operable with a lower voltage and less power consumption. Liquid crystal devices have been frequently used in various fields because of the merit that they are operable with a low voltage and less power consumption. Liquid crystal devices however have the demerits that one hardly receives a clear information therefrom when he or she views them at an angle outside the specific ranges, as well as that their power consumption is not so small as expected because they usually require backlight. Organic EL device has appeared as information displaying means which may overcome these demerits.

Organic EL device is a class of light-emitting device which utilizes electroluminescence such as fluorescence or phosphorescence: It usually comprises a luminescent layer incorporated with a luminescent compound and inserted between a cathode and anode to which dc voltage is energized to inject holes and electrons in the luminescent layer so that a pair of hole and electron recouple each other to make in the luminescent compound an excited state which subsequently returns to the ground state to emit such luminescence. Organic EL device is characterized in that its luminescent color tint can be controlled to a desired level by selecting an appropriate organic compound to be used as host compound in the formation of luminescent layer, and screening guest compounds (or dopants) which may match with the host compound. This may remarkably increase the brightness and life expectancy for luminescence in organic EL device, dependently upon the combination of host and guest compounds. Organic EL device has been deemed to be in principle an excellent device because of the merit that it does realize an autonomous light emission and this would advantageously save power consumption.

Many of organic EL devices proposed hitherto however have the disadvantage that they are low in durability, and therefore their brightness decreases within a short period of time when used under severe conditions, for example, in case of equipping them to automobiles where mechanical vibrations and high temperatures are unavoidable.

In view of such situation, the objectives of this invention are to provide a luminescence-assisting agent which would be useful even in highly durable organic EL devices, as well as to provide its uses.

DISCLOSURE OF INVENTION

To attain these objectives, the present inventors eagerly researched and screened coumarin derivatives, resulting in the finding that in organic EL devices, a coumarin derivative which comprises a coumarin ring, a naphthalene ring with one or more hydrocarbon groups, and a five-membered heterocycle condensed with the naphthalene ring so as to give an electronic resonance through the coumarin and naphthalene rings gives no luminescence, but effectively accelerates the transfer of excited energy in host compound to guest compound when used in combination with appropriate host and guest compounds: As the result, a highly bright electroluminescence consistently prolongs over a long period of time even under severe conditions.

Particularly, this invention attains the above objective by providing an organic EL device which uses as a luminescence-assisting agent the coumarin derivative represented by either General Formula 1 or 2:

General Formula 1:

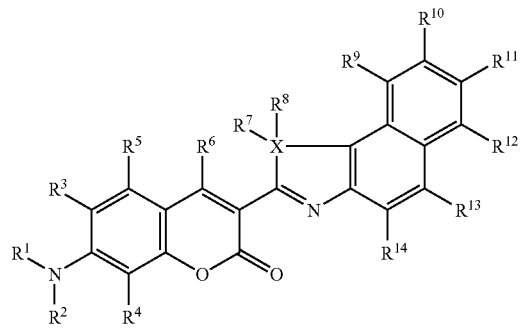

General Formula 2:

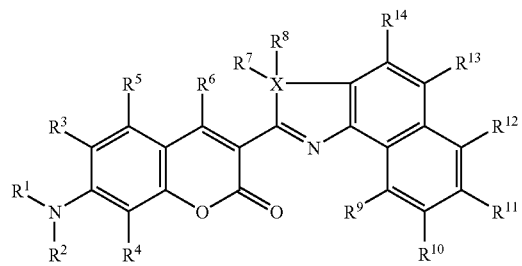

(In General Formulae 1 and 2, X denotes carbon atom or a heteroatom. $R^1$ to $R^{14}$ independently denote hydrogen atom or an arbitrary substituent, provided that $R^3$ and/or $R^4$ are apparently absent when $R^1$ and/or $R^2$ form a ring structure containing both the nitrogen atom linked with $R^1$ and/or $R^2$ and the carbon atom linked with $R^3$ or $R^4$. At least one of $R^9$ to $R^{14}$ is a hydrocarbon group which may bear a substituent. In case that X is a divalent or trivalent heteroatom, $R^7$ and/or $R^8$ are absent.)

This invention also attains the above objective by providing a display panel which uses such organic EL device.

In addition, this invention attains the above objective by providing an information displaying equipment which uses such organic EL device.

Furthermore, this invention attains the above objective by providing a luminescence-assisting agent for use in organic EL device which employs the coumarin derivative represented by either General Formula 1 or 2:

General Formula 1:

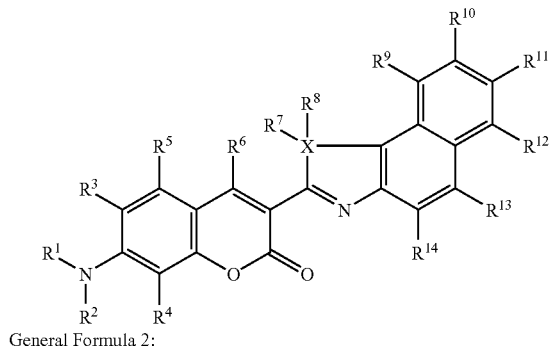

General Formula 2:

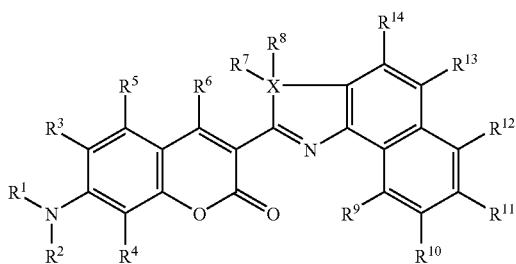

(In General Formulae 1 and 2, X denotes carbon atom or a heteroatom. $R^1$ to $R^{14}$ independently denote hydrogen atom or an arbitrary substituent, provided that $R^3$ and/or $R^4$ are apparently absent when $R^1$ and/or $R^2$ form a ring structure containing both the nitrogen atom linked $R^1$ and/or $R^2$ and the carbon atom linked with $R^3$ or $R^4$. At least one of $R^9$ to $R^{14}$ is a hydrocarbon group which may bear a substituent. In case that X is a divalent or trivalent heteroatom, $R^7$ and/or $R^8$ are absent.)

Either of the coumarin derivatives represented by General Formula 1 or 2 is a novel organic compound which has not been documented in literatures. This invention is based on the creation of novel organic compounds, as well as on the discovery of their properties useful in industries.

Figure 1:
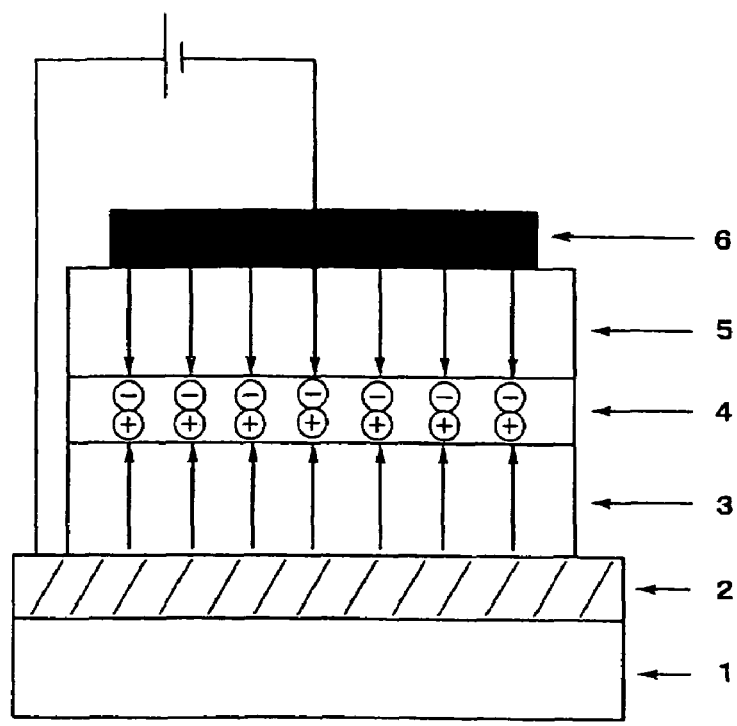
FIG. 1 is a brief figure of an example for organic EL device according to this invention.

In the Figures, the reference numerals 1 and 10 represent substrates; 2 and 14, anodes; 3 and 16, hole transportation layers; 4 and 18, luminescent layers; 5, an electron transportation layer; 6 and 20, cathodes; 30, a dc source; 32 and 34, voltage-elevating circuits; 36 and 46, driving circuits; 38, a microcomputer; 40, a clock pulse-generating circuit; 42 and 44, oscillating circuits; and 48, a display panel.

BEST MODE FOR CARRYING OUT THE INVENTION

The following is to explain embodiments according to this invention: As mentioned heretofore, this invention relates to an organic EL device using as luminescence-assisting agent the coumarin derivative represented by either General Formula 1 or 2. The wording "luminescence-assisting agent" as referred to in this invention means a luminescent organic material to be used together with host and guest compounds to form a luminescent layer in an organic EL device, which never gives a luminescence and only accelerates the transfer of excited energy in host compound to guest compound to assist the luminescence of other compounds.

General Formula 1:

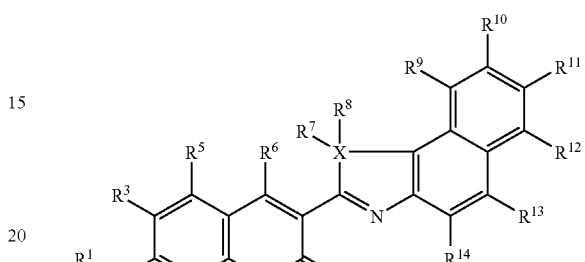

General Formula 2:

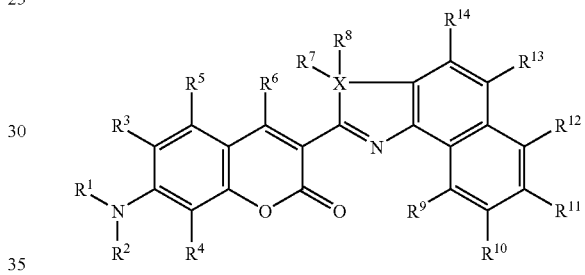

In General Formulae 1 and 2, X denotes carbon atom or a heteroatom. As to the heteroatom in X, usually, one can choose an atom of the group 15 or 16 in the periodic chart of elements, such as nitrogen, oxygen, sulfur, selenium and tellurium atoms. Among these carbon and heteroatoms, carbon, nitrogen, oxygen and sulfur atoms are preferable because coumarin derivatives with such atom are superior in optical properties and producibilities.

$R^1$ to $R^{14}$ in General Formulae 1 and 2 independently denote hydrogen atom or an arbitrary substituent. The substituents in $R^1$ to $R^{14}$ are, for example, aliphatic hydrocarbon groups with a carbon number of up to 20, such as methyl, ethyl, propyl, isopropyl, isopropenyl, 1-propenyl, 2-propenyl, butyl, isobutyl, sec-butyl, tert-butyl, 2-butenyl, 1,3-butadienyl, pentyl, isopentyl, neopentyl, tert-pentyl, 1-methylpentyl, 2-methylpentyl, 2-pentenyl, hexyl, isohexyl, 5-methylhexyl, heptyl, octyl, nonyl, decyl, undecyl, dodecyl and octadecyl groups; alicyclic hydrocarbon groups such as cyclopropyl, cyclobutyl, cyclopentyl, cyclohexyl, cyclohexenyl and cycloheptyl groups; aromatic hydrocarbon groups such as phenyl, o-tolyl, m-tolyl, p-tolyl, xylyl, mesityl, o-cumenyl, m-cumenyl, p-cumenyl, benzyl, phenethyl and biphenylyl groups; ether groups such as methoxy, ethoxy, propoxy, isopropoxy, butoxy, isobutoxy, sec-butoxy, tert-butoxy, pentyloxy, phenoxy and benzyloxy groups; ester groups such as ethoxycarbonyl, propoxycarbonyl, acetoxy and benzoyloxy groups; halogen groups such as fluoro, chloro, bromo and iodo groups; hydroxy group; carboxy group; cyano group; nitro group; and combinations thereof.

Dependently upon uses, it is preferable to choose as substituents in $R^1$ and $R^2$ an aliphatic, alicyclic, aromatic hydrocarbon or combination thereof, while those in $R^6$, for example, short-chain aliphatic hydrocarbon groups such as methyl, ethyl, propyl, isopropyl, butyl, isobutyl, sec-butyl, tert-butyl, pentyl, isopentyl, neopentyl and tert-pentyl groups; ether groups such as methoxy, ethoxy, propoxy, isopropoxy, butoxy, isobutoxy, sec-butoxy, tert-butoxy, pentyloxy, phenoxy and benzyloxy groups; ester groups such as methoxycarbonyl, ethoxycarbonyl, propoxycarbonyl, acetoxy and benzoyloxy groups; and cyano group: One or more hydrogen atoms in these substituents may be replaced by halogen group(s) such as fluoro group. As mentioned heretofore, at least one of the substituents in $R^9$ to $R^{14}$ is a hydrocarbon group such as aliphatic, alicyclic or aromatic hydrocarbon group or a combination thereof: Among these, it is preferable to choose an aliphatic hydrocarbon group, in particular, an aliphatic hydrocarbon group having a branched-chain structure and a carbon number of up to 6, such as isopropyl, isobutyl, sec-butyl, tert-butyl, isopentyl, neopentyl, tert-pentyl, 1-methylpentyl, 2-methylpentyl and isohexyl groups. As to the substituents in $R^7$ and $R^8$, it is preferable to choose a similar aliphatic, alicyclic or aromatic hydrocarbon group or a combination thereof as those in $R^1$ and $R^2$, provided that X is a divalent or trivalent heteroatom, and $R^7$ and/or $R^8$ are absent. In case that the carbon linked with $R^3$ and/or $R^4$ forms no ring structure such as piperidine or julolidine ring, one can choose as $R^3$ and/or $R^4$ hydrogen atom or an arbitrary substituent as described above, dependently upon uses. As to $R^5$, one can choose hydrogen atom or hydroxyl group because coumarin derivatives therewith are superior in producibility, and alternatively an ether or ester group as described above while considering the uses of coumarin derivatives.

In certain applications such as organic EL device where luminescence-releasing ability is one of important factors, it is preferable to choose a coumarin derivative as represented by General Formula 3 or 4, where both $R^1$ and $R^2$ are aliphatic hydrocarbon groups which are in the linkage with the carbon atom bound to either $R^3$ or $R^4$ forming julolidine ring. In General Formulae 3 and 4, X denotes carbon or a heteroatom similar to that in General Formula 1 or 2, while $R^5$ to $R^{14}$ denote hydrogen or an arbitrary substituent similar to those in General Formula 1 or 2 and at least one of $R^9$ to $R^{14}$, a hydrocarbon group. $R^{15}$ to $R^{18}$ independently denote hydrogen or an aliphatic hydrocarbon group: Among these, it is preferable to choose as aliphatic hydrocarbon group a short-chain aliphatic hydrocarbon group such as methyl, ethyl, propyl, butyl or pentyl group. Among the coumarin derivatives represented by General Formula 3 or 4, those where at least one of $R^9$ to $R^{14}$ is a branched aliphatic hydrocarbon group such as isopropyl, isobutyl, sec-butyl, tert-butyl, isopentyl, neopentyl, tert-pentyl, 1-methylpentyl, 2-methylpentyl or isohexyl group are characterized in that they are superior in luminescence-assisting ability and solubility in usual organic solvents, as well as in that their luminescence-assisting abilities are hardly weakened even under conditions where elevated temperatures are unavoidable because they are high in glass transition point and therefore large in thermal stability.

General Formula 3:

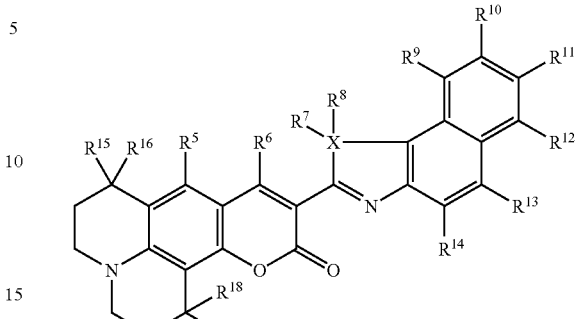

General Formula 4:

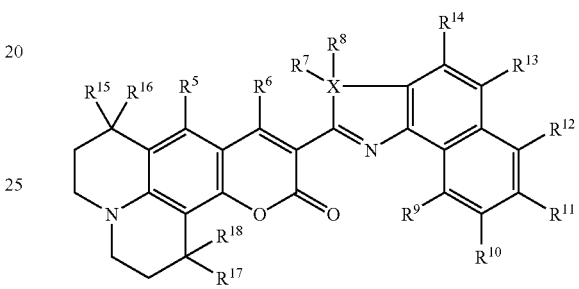

The coumarin derivatives represented by Chemical Formulae 1 to 27 are illustrative for those feasible in this invention. These effectively accelerate the transfer of excited energy in host compound to guest compound when used as luminescence-assisting agent in organic EL devices. Many of the coumarin derivatives represented by General Formula 1 or 2 are significantly higher in glass transition point (130° C. or higher), in particular, 150° C. or higher dependently upon substituents as seen in the coumarin derivative represented by Chemical Formula 18, and, as the result, larger in thermal stability in comparison with conventional analogous compounds. The glass transition point of the coumarin derivative according to this invention can be determined, for example, by usual differential scanning calorimetry (abbreviated as "DSC analysis" hereinafter) as described later.

Chemical Formula 1:

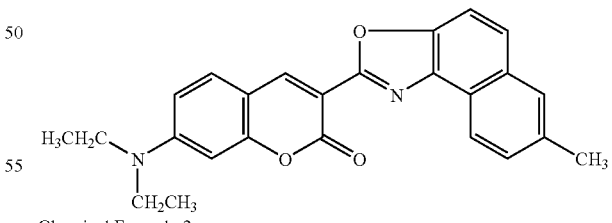

Chemical Formula 2:

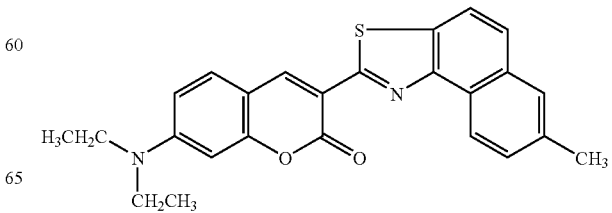

Chemical Formula 3:
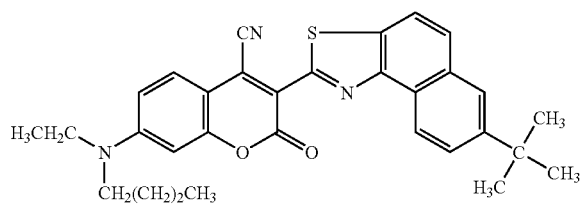
Chemical Formula 4:
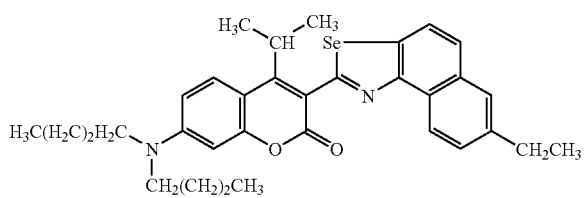
Chemical Formula 5:
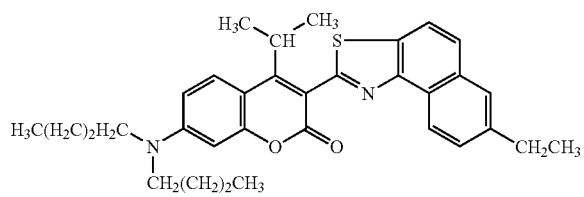
Chemical Formula 6:
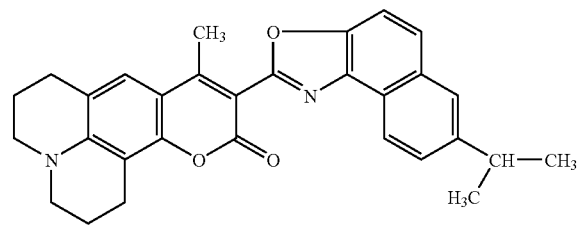
Chemical Formula 7:
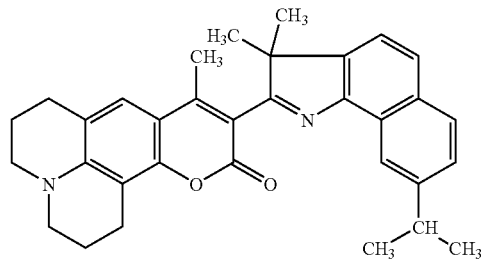
Chemical Formula 8:
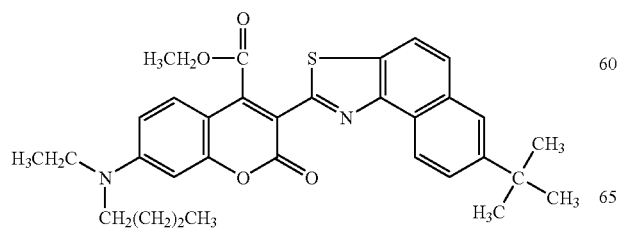
Chemical Formula 9:
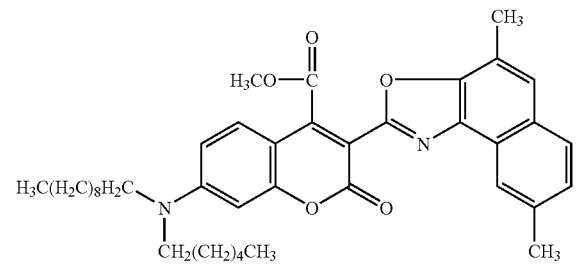
Chemical Formula 10:
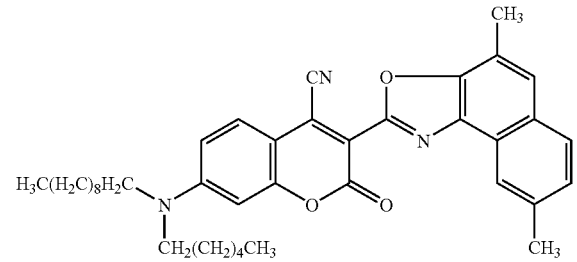
Chemical Formula 11:
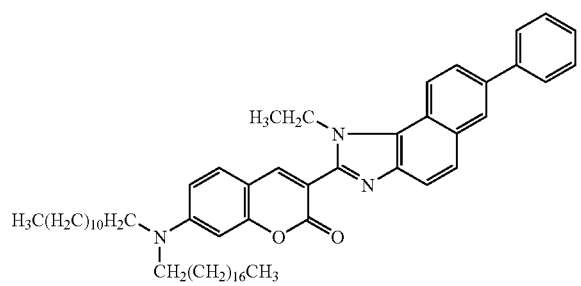
Chemical Formula 12:
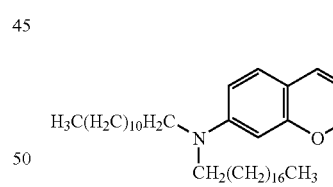
Chemical Formula 13:
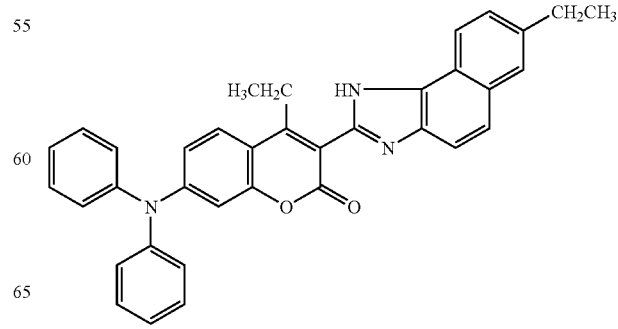

Chemical Formula 14:
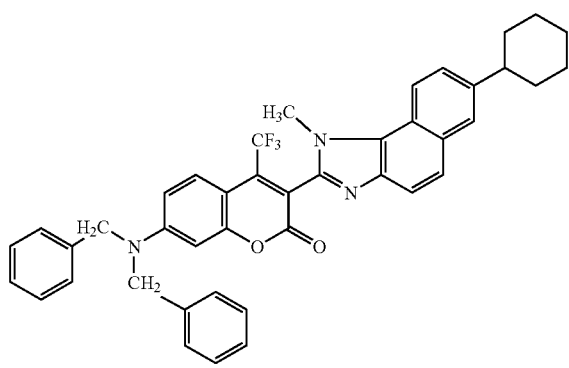
Chemical Formula 15:
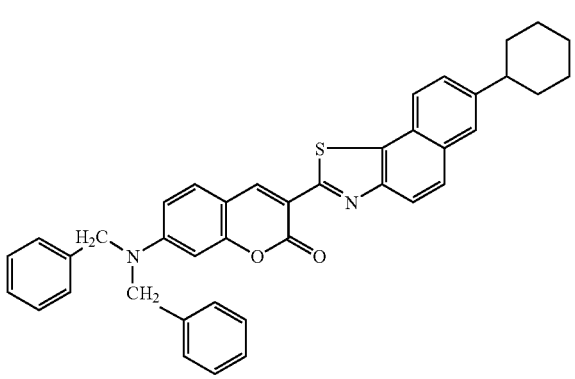
Chemical Formula 16:
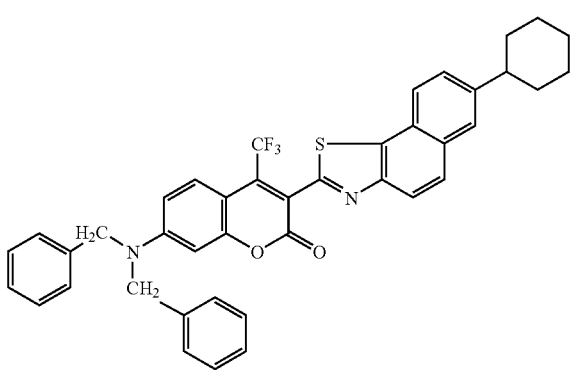
Chemical Formula 17:
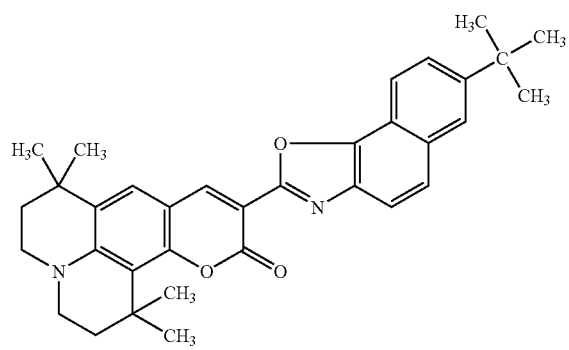
Chemical Formula 18:
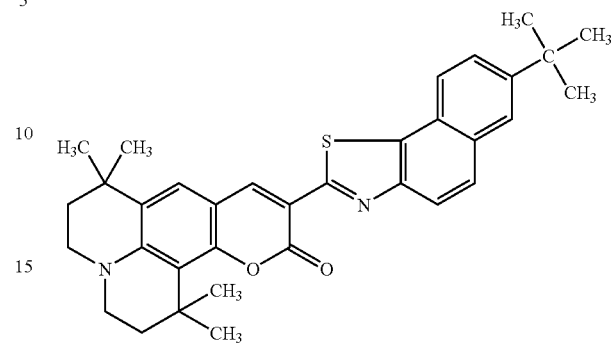
Chemical Formula 19:
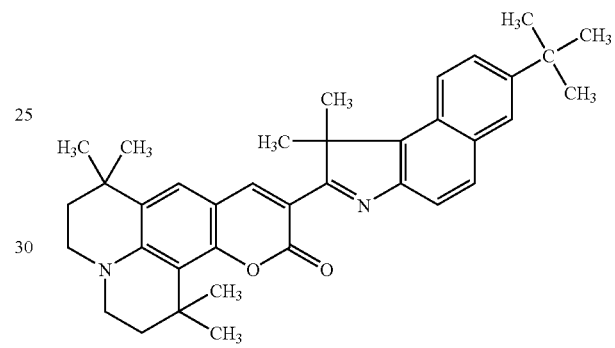
Chemical Formula 20:
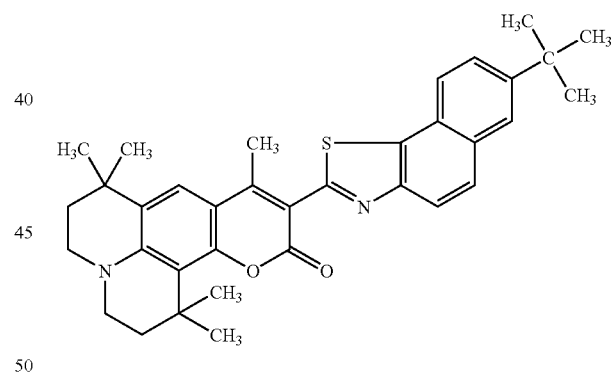
Chemical Formula 21:
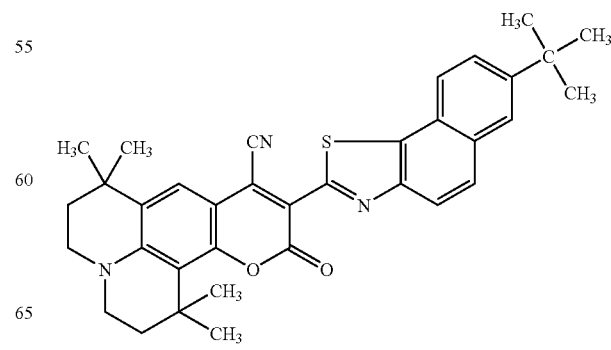

Chemical Formula 22:

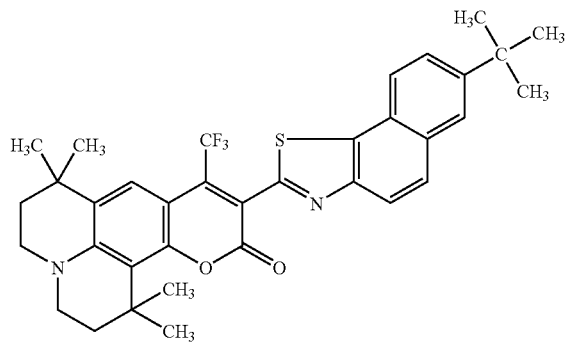

Chemical Formula 23:

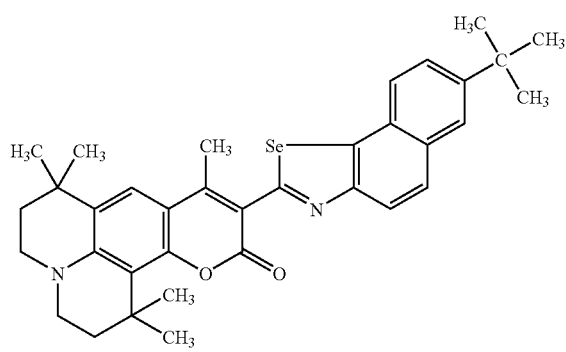

Chemical Formula 24:

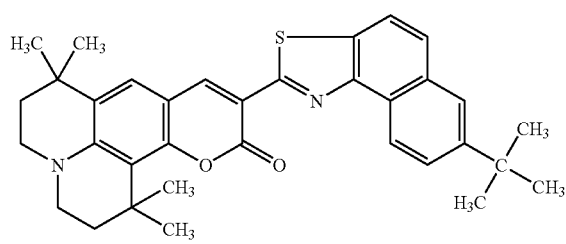

Chemical Formula 25:

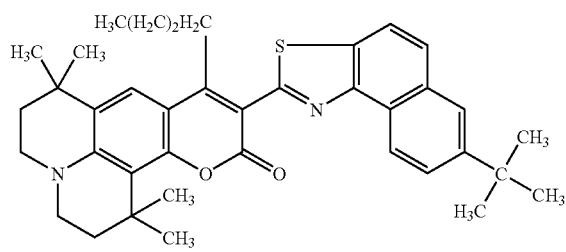

Chemical Formula 26:

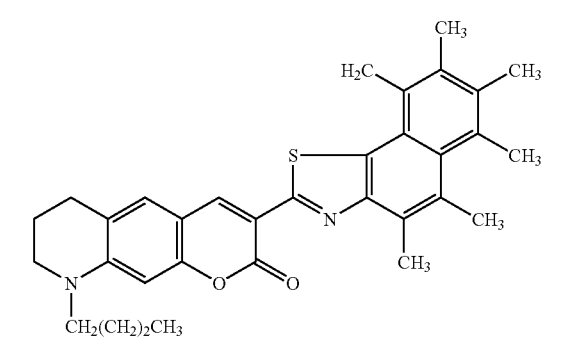

Chemical Formula 27:

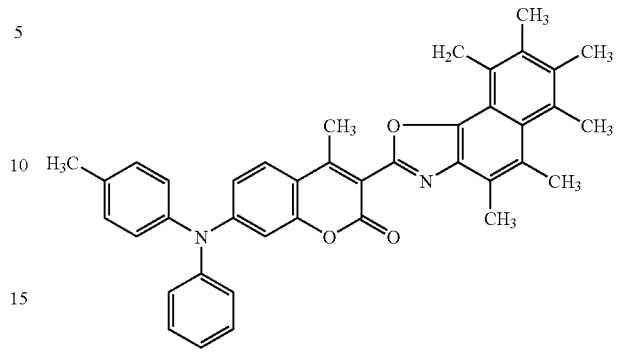

The coumarin derivatives feasible in this invention can be prepared by various ways: With an economical viewpoint, it is preferable to employ a process including the step of allowing the compound represented by General Formula 7 which has $R^1$ to $R^6$ corresponding to those in General Formula 1 or 2 to react with the compound represented by General Formula 8 or 9 which has $R^7$ to $R^{14}$ corresponding to those in General Formula 1 or 2. In General Formula 8 or 9, in case that X is a divalent or trivalent heteroatom, $H^1$ and $H^2$ are absent.

General Formula 7:

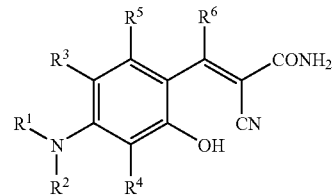

General Formula 8:

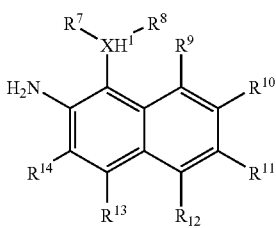

General Formula 9:

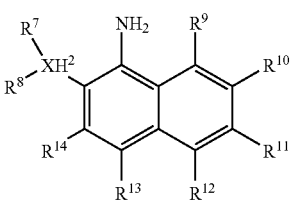

Particularly, adequate (usually roughly equimolar) amounts of the compound represented by General Formula 7 and the compound represented by General Formula 8 or 9 are placed in a reaction vessel, dissolved in an appropriate solvent, if necessary, admixed with either a basic compound, for example, sodium hydroxide, potassium hydroxide, sodium carbonate, potassium carbonate, sodium hydrogen-carbonate, sodium acetate, ammonia, triethylamine, piperidine, pyridine, pyrrolidine, aniline, N,N-dimethylaniline or N,N-diethylaniline, an acidic compound such as hydrochloric acid, sulfuric acid, nitric acid, acetic acid, acetic anhydride, trifluoroacetic acid, p-toluenesulfonic acid, methanesulfonic acid or trifluromethanesufonic acid or a Lewis acidic compound such as aluminium chloride, zinc chloride, tin tetrachloride or titanium tetrachloride, and then allowed to react at ambient or higher temperature while stirring under refluxing conditions.

As to solvents, one can choose hydrocarbons such as pentane, hexane, cyclohexane, octane, benzene, toluene and xylene; halides such as carbon tetrachloride, chloroform, 1,2-dichloroethane, 1,2-dibromoethane, trichloroethylene, tetrachloroethylene, chlorobenzene, bromobenzene and α-dichlorobenzene; alcohols and phenols such as methanol, ethanol, 1-propanol, 2-propanol, 1-butanol, 2-butanol, isobutyl alcohol, isopentyl alcohol, cyclohexanol, ethylene glycol, propylene glycol, 2-methoxyethanol, phenol, benzyl alcohol, cresole, diettylene glycol, triethylene glycol and glycerin; ethers such as diethyl ether, diisopropyl ether, tetrahydrofuran, tetrahydropyran, 1,4-dioxane, anisole, 1,2-dimethoxyethane, diethylene glycol dimethyl ether, dicyclohexyl-18-crown-6, methylcarbitol and ethylcarbitol; acids and acid derivatives such as acetic acid, acetic anhydride, trichloroacetic acid, trifluoroacetic acid, propionic anhydride, ethyl acetate, butyl carbonate, ethylene carbonate, propylene carbonate, formamide, N-methylformamide, N,N-dimethylformamide, N,N-dimethylacetoamide, hexamethylphosphoric triamide and phosphoric trimethyl; nitriles such as acetonitrile, propionitrile, succinonitrile and benzonitrile; nitro compounds such as nitromethane and nitrobenzene; sulfur-containing compounds such as dimethylsulfoxide and sufolane; and water which may be used in combination, if necessary.

In case of using solvents, generally, a larger amount of solvent leads to a less reaction efficiency, while a less amount of solvent, a more difficulty in homogenous heating and stirring and also in a more liability of side reactions. Thus, it is desirable to set the amount of solvent to a level of up to 100-folds, usually, 5 to 50-folds by weight against the total amounts of material compounds to be used. The reaction completes within 10 hours, usually, 0.5 to 5 hours, dependently upon the type of material compounds and reaction conditions. The progress of reaction can be monitored by conventional method, for example, thin layer chromatography, gas chromatography and high-performance liquid chromatography. The coumarin derivatives feasible in this invention are obtainable in a good yield by or in accordance with such process. The compounds represented by General Formulae 7 to 9 are obtainable by usual methods which are to prepare analogous compounds.

Prior to uses, the coumarin derivatives thus obtained are usually purified with a method(s) usually employed in the purification of analogous compounds, such as dissolution, extraction, separation, decantation, filtration, concentration, thin layer chromatography, column chromatography, gas chromatography, high-performance liquid chromatography, distillation, sublimation and crystallization which may be applied in combination, if necessary. Dependently upon the type of coumarin derivatives and uses of organic EL devices, it is desirable to highly purify coumarin derivatives with distillation, crystallization and/or sublimation, prior to their uses.

Among these, sublimation is superior to others because high-purity crystals can be easily obtained through a single step with a less loss for coumarin derivatives during purification, as well as because solvent is not incorporated in crystals. Although both atmospheric and reduced pressure sublimation methods are applicable to this invention, the latter method is usually employed. To sublimate coumarin derivatives in vacuo, for example, an adequate amount of a coumarin derivative is placed in a sublimation purification apparatus, and then heated at the lowest possible temperature, in particular, at a temperature lower than its melting point while keeping the pressure inside the apparatus at $10^{-2}$ Torr or lower, desirably, $10^{-3}$ Torr or lower so that the coumarin derivative does not cause decomposition. When the purity of a coumarin derivative to be subjected to sublimation purification is lower, the sublimation rate is reduced so as to avoid the incorporation of impurities by increasing or decreasing the pressure and/or heating temperature in the apparatus, while the sublimation is accelerated by aerating the inner space of the apparatus with an inert gas such as rare gas when a coumarin derivative is less sublimatable. The size of crystals obtained by sublimation can be controlled by elevating or reducing temperature at the condensation surface in the apparatus: When the condensation surface is kept at a temperature slightly lower than heating temperature so that the coumarin derivative gradually crystallizes, one can obtain crystals of a larger size.

As described heretofore, the coumarin derivative according to this invention is very useful as luminescence-assisting agent in organic EL devices because when used in combination with appropriate host and guest compounds, it effectively accelerates the transfer of excited energy in host compound to guest compound, as well as exhibiting a large thermal resistance and giving a stable thin membrane in glass state. The wording "organic EL device(s)" as referred to as in this invention means electroluminescent devices in general which use such coumarin derivative as luminescence-assisting agent: One of the most important targets to which this invention is applied is an organic EL device of mono- or multi-layer type comprising a cathode to be energized with a positive voltage, an anode to be energized with a negative voltage, a luminescent layer where hole and electron are allowed to recouple each other so as to obtain a luminescence, and arbitrarily a hole injection/transportation layer for injecting and transporting holes from the cathode, an electron injection/transportation layer for injecting and transporting electrons from the anode, and a hole-blocking layer for suppressing the transportation of holes from the luminescent layer to the electron injection/transportation layer.

As well known in the art, the action mechanism of organic EL devices essentially consists of the steps of injecting electrons and holes from electrodes, allowing the electrons and holes to move in solids, allowing the electrons and holes to recouple to give singlet or triplet excitons, and allowing the excitons to emit a luminescence: Mono- and multi-layered organic EL devices are essentially indifferent each other in these steps. However, in mono-layered organic EL devices, the characteristics of the above four steps can not be improved if one changes the molecular structure of luminescent compounds, while in multi-layered organic EL devices, the properties required in each step can be distributed to a plurality of materials which are independently optimized: Thus, multi-layered organic EL devices attain a prescribed performance more easily than mono-layered organic EL devices.

Because of these, the organic EL device of this invention will be explained hereinafter with reference to an example for multi-layered organic EL device. FIG. 1 is a brief figure of an example for multi-layered organic EL device according to this invention. In FIG. 1, the reference numeral 1 represents a substrate which is provided by forming a substrate material including a glass such as aluminosilicate glass, aluminoborosilicate glass, silica glass, soda lime glass, barium silicate glass, barium borosilicate glass or borosilicate glass; a plastic such as aramid, acrylic resin, polyallylate, polyimide, polyurethane, polyetherketone, polyethersulfone, polyester, polyethylene, poly (ethylene terephthalate), polyolefin, polycarbonate, polysulfone, poly (vinyl chloride), polypropylene, poly (methyl acrylate), epoxy resin, phenol resin, fluorine resin or melamine resin; or a ceramic such as alumina, silicon, silica or silicon carbide into a plate, sheet or film which may be laminated to each other, if necessary. Preferred substrate materials are a glass for photomask such as aluminosilicate glass, aluminoborosilicate glass, silica glass, borosilicate glass and barium borosilicate glass which are low in both alkali content and thermal expansion coefficient, plane and free of scratches on their surface and easily grindable; and plastics such as aramides, epoxys, phenols, polyallylates, polyimides, polyesters, aromatic polyethers, polyolefins, melamines and fluorines which are superior in affinity to adjacent electric conductive membrane and lower in moisture permeability, while opaque ceramic materials such as silicon may be used in combination with transparent electrode material(s). When it is necessary to control the chromaticity of luminescence, chromaticity adjusting means such as filter membrane, chromaticity conversion membrane and dielectric reflection membrane is provided in an appropriate part of the substrate 1.

The reference numeral 2 represents an anode, which is formed by preparing one or more metals or electric conductive compounds low in electric resistivity but high in optical transmissivity throughout the visible region into a single or plurality of membrane(s) with a thickness of 10 to 1,000 nm, desirably, 50 to 500 nm to give an electric resistivity of 1 k$\Omega$/□ or lower, desirably, 5 to 50 $\Omega$/□ for the anode 2 with a method such as vacuum deposition, spattering, chemical vapor deposition (CVD), atom layer epitaxy (ALE), embrocation or immersion while allowing the membrane(s) to contact with either surface of the substrate 1. Examples of electric conductive materials feasible in the anode 2 are metals such as gold, platinum, aluminium and nickel; metal oxides such as zinc oxide, tin oxide, indium oxide and mixtures of tin oxide and indium oxide (abbreviated as "ITO" hereinafter); and electric conductive oligomers and polymers of repeating aniline, thiophene or pyrrole units. Among these, ITO is characterized in that one can easily obtain preparations with a reduced resistivity, as well as in that minute patterns can be easily provided by etching with acids.

The reference numeral 3 represents a hole injection/transportation layer, which is usually formed with a method similar to that in the anode 2 by preparing the hole injection/transportation layer material into a membrane with a thickness of 1 to 1,000 nm while allowing it to contact with the anode 2. As to hole injection/transportation layer materials, it is desirable to choose a material which exhibits a low ionization potential and a hole mobility of, for example, at least $10^{-6}$ cm$^2$/V• second under an electric field of $10^4$ to $10^6$ V/cm so as to facilitate the injection and transportation of holes from the anode 2. Particular hole injection/transportation layer materials are, for example, arylamine, imidazole, oxadiazole, oxazole, triazole, chalcone, styryl anthracene, stilbene, tetraarylethene, triarylamine, triarylethene, triarylmethane, phthalocyanine, fluorenone, hydrazone, N-vinylcarbazole, pyrazoline, pyrazolone, phenylanthracene, phenylenediamine, polyarylalkane, polysilane, polyphenylenevinylene and porphyrin derivatives which are usually used in organic EL devices: These may be used in combination, if necessary. Among these, the much more preferable are monomers and polymers in an aromatic tertial amine form which are of an arylamine such as monoarylamine, diarylamine, triarylamine and tetraarylamine.

The reference numeral 4 represents a luminescent layer, which is usually formed with a method similar to those in the anode 2 by preparing one or more coumarin derivatives of this invention with or without premixing an appropriate host and guest compounds into a single or adjacent separate membrane(s) with a thickness of 1 to 1,000 nm, preferably, 2 to 200 nm while allowing it or them to contact with the hole injection/transportation layer 3. Dependently upon the types of host and guest compounds to be used in combination, the ratio of the guest compound(s) against the host compound(s) is usually in the range of 0.1 to 10 mol %, desirably, 0.5 to 5 mol % while the coumarin derivative of this invention as luminescence-assisting agent is usually used in the range of 0.1:10 to 10:0.1, desirably, 0.5:5 to 5:0.5 against guest compound in terms of the molar ratio. The luminescence-assisting agent for use in organic EL device according to this invention never hinder the incorporation of luminescent organic compound(s) other than those represented by General Formula 1 or 2: One or more other luminescence-assisting agents can be arbitrarily incorporated thereto, if necessary, as long as such incorporation does not fall outside the objectives of this invention. For example, the coumarin compounds disclosed in Japanese Patent Kokai No. 2001-76876 are illustrative for such auxiliary luminescence-assisting agent.

Particular host compounds to be used in combination with the luminescence-assisting agent of this invention are, for example, quinolinol metal complexes, condensed polycyclic aromatic hydrocarbons, for example, anthracene, chrysene, coronene, triphenylene, naphthacene, naphthalene, phenanthrene, picene, pyrene, fluorene, perylene, benzopyene and their derivatives; hydrocarbon ring assemblies such as quaterphenyl, 1,4-diphenylbutadiene, terphenyl, stilbene, tetraphenylbutadiene, biphenyl and their derivatives; heterocyclic compounds such as oxadiazole, carbazole, pyridazine, benzimidazole, benzoxazole, benzothiazole and their derivatives; quinacridone, rubrene compounds and their derivatives; and polymethyne dyes of styryl type which are usually used in organic EL devices.

Among these, it is preferable to choose quinolinol metal complexes, copper phthalocyanines and aromatic tertiary amines such as $N^4$, $N^{4'}$-dinaphthalene-1-yl-$N^4$, $N^{4'}$-diphenyl-biphenyl-4, 4'-diamine, $N^4$, $N^{4'}$-diphenyl-$N^4$, $N^{4'}$-di-m-tolyl-biphenyl-4, 4'-diamine, $N^4$, $N^4$, $N^{4'}$, $N^{4'}$-tetrakis-biphenyl-4-yl-biphenyl-4, 4'-diamine and tris-{4-(phenyl-m-tolyl-methyl)-phenyl}-amine with respect to energy transferring efficiency. The wording "quinolinol metal complex(es)" as referred to as in this invention means complexes in general comprising a quinolinol, such as 8-quinolinol and benzoquinoline-10-ol, which bears in the same molecule a pyridine residue and hydroxyl group and behaves as ligand; and a univalent, divalent or trivalent metal or its oxide of the group 1, 2, 12 or 13 in the periodic chart of elements, such as lithium, sodium, potassium, beryllium, magnesium, calcium, zinc, boron, aluminium, gallium and indium, which behaves as center metal and receives an electron pair from the nitrogen atom in the pyridine residue to form a coordinate bond with the ligand. In case that ligand is either 8-quinolinol or benzoquinoline-10-ol, it may bear one or more substituents, never hindering one or more substituents, for example, halogen groups such as fluoro, chloro, bromo and iodo groups; aliphatic hydrocarbon groups such as methyl, trifluoromethyl, ethyl, propyl, isopropyl, butyl, isobutyl, sec-butyl, tert-butyl, pentyl, isopentyl, neopentyl and tert-pentyl groups; ether groups such as methoxy, trifluoromethoxy, ethoxy, propoxy, isopropoxy, butoxy, isobutoxy, sec-butoxy, tert-butoxy, pentyloxy, isopentyloxy, hexyloxy, phenoxy and benzyloxy groups; ester groups such as acetoxy, trifluoroacetoxy, benzoylacetoxy, methoxycarbonyl, trifluoromethoxycarbonyl, ethoxycarbonyl and propoxycarbonyl groups; cyano group; nitro group and sulfone group to be bound to carbon(s) other than those at the 8- or 10-positions to which hydoxyl group(s) is linked. In case that a quinolinol metal complex has two or more ligands in the same molecule, they may be the same or different each other.

Particular quinolinol metal complexes are, for example, aluminium complexes such as aluminium-tris(8-quinolinolato), aluminium-tris(3,4-dimethyl-8-quinolinolato), aluminium-tris(4-methyl-8-quinolinolato), aluminium-tris(4-methoxy-8-quinolinolato), aluminium-tris(4,5-dimethyl-8-quinolinolato), aluminium-tris(4,6-dimethyl-8-quinolinolato), aluminium-tris(5-chloro-8-quinolinolato), aluminium-tris(5-bromo-8-quinolinolato), aluminium-tris(5,7-dichloro-8-quinolinolato), aluminium-tris(5-cyano-8-quinolinolato), aluminium-tris(5-sulfonyl-8-quinolinolato), aluminium-tris(5-propyl-8-quinolinolato) and aluminium-tris(2-methyl-8-quinolinolato); zinc complexes such as zinc-bis(8-quinolinolato), zinc-bis(2-methyl-8-quinolinolato), zinc-bis(2,4-dimethyl-8-quinolinolato), zinc-bis(2-methyl-5-chloro-8-quinolinolato), zinc-bis(2-methyl-5-cyano-8-quinolinolato), zinc-bis(3,4-dimethyl-8-quinolinolato), zinc-bis(4,6-dimethyl-8-quinolinolato), zinc-bis(5-chloro-8-quinolinolato) and zinc-bis(5,7-dichloro-8-quinolinolato); beryllium complexes such as beryllium-bis(8-quinolinolato), beryllium-bis(2-methyl-8-quinolinolato), beryllium-bis(2,4-dimethyl-8-quinolinolato), beryllium-bis(2-methyl-5-chloro-8-quinolinolato), beryllium-bis(2-methyl-5-cyano-8-quinolinolato), beryllium-bis(3,4-dimethyl-8-quinolinolato), beryllium-bis(4,6-dimethyl-8-quinolinolato), beryllium-bis(5-chloro-8-quinolinolato), beryllium-bis(4,6-dimethyl-8-quindlinolato) and beryllium-bis(10-hydroxybenzo[h]quinolinolato); magnesium complexes such as magnesium-bis(8-quinolinolato), magnesium-bis(2-methyl-8-quinolinolato), magnesium-bis(2,4-dimethyl-8-quinolinolato), magnesium-bis(2-methyl-5-chloro-8-quinolinolate), magnesium-bis(2-methyl-5-cyano-8-quinolinolato), magnesium-bis(3,4-dimethyl-8-quinolinolato), magnesium-bis(4,6-dimethyl-8-quinolinolato), magnesium-bis(5-chloro-8-quinolinolato) and magnesium-bis(5,7-dichloro-8-quinolinolato); indium complexes such as indium-tris(8-quinolinolato); gallium complexes such as gallium-tris(5-chloro-8-quinolinolato); and calcium complexes such as calcium-bis(5-chloro-8-quinolinolato) which may be used in combination, if necessary. The above host compounds are listed only for illustration, and intended in no way to limit to these the host compounds feasible in this invention.

Examples of guest compounds to be used in combination with the luminescence-assisting agent according to this invention are quinuclidone, coumarin, thiopyran, pyran, perylene, rubrene and their derivatives which are usually used in this art: These may be used in combination, if necessary. These are listed only for illustration, and intended in no way to limit to these the guest compounds to be used in combination with the luminescence-assisting agent according to this invention. Among these, pyran compounds such as dicyanomethylenepyran, dicyanomethylenethiopyran and coumarin compounds are preferred with respect to energy transferring efficiency. For example, General Formula 5 is illustrative for such dicyanomethylenepyran and dicyanomethylenethiopyran compounds.

General Formula 5:

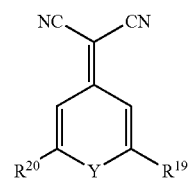

In General Formula 5, Y denotes a heteroatom selected from oxygen and sulfur atoms. $R^{19}$ denotes an aminostyryl group, while $R^{20}$ denotes either another aminostyryl group or a short-chain aliphatic hydrocarbon group such as methyl, ethyl, propyl, isopropyl, butyl, isobutyl, sec-butyl, tert-butyl, pentyl, isopentyl, neopentyl or tert-pentyl group; an alicyclic hydrocarbon group such as cyclopropyl, cyclobutyl, cyclopentyl, cyclohexyl or cyclohexenyl group; an aromatic hydrocarbon groups such as phenyl, o-tolyl, m-tolyl, p-tolyl, xylyl, mesityl, o-cumenyl, m-cumenyl, p-cumenyl or biphenylyl group; or a combination thereof As to the aminostyryl groups in $R^{19}$ and $R^{20}$, their amino groups are in primary, secondary or tertiary amine form and bound to the benzene rings at their 2- or 4-position against the vinyl groups. Such amino group may be linked with the benzene ring in the styryl group to form a cyclic structure such as piperidine and julolidine rings. Particular pyran compounds are, for example, those represented by Chemical Formulae 28 to 31.

Chemical Formula 28:

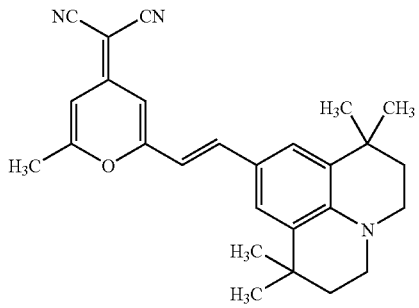

Chemical Formula 29:

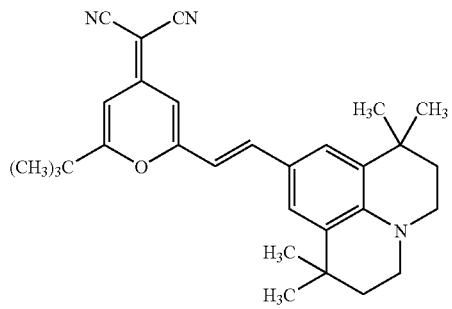

Chemical Formula 30:

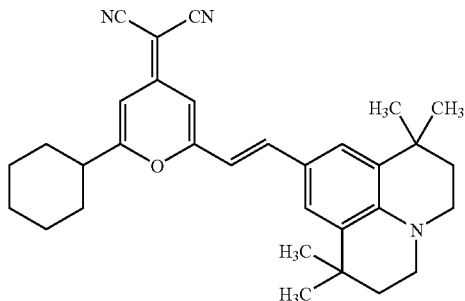

Chemical Formula 31:

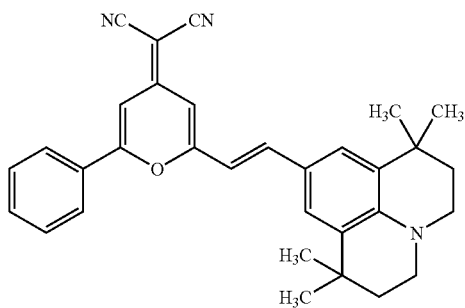

General Formula 6 exemplifies coumarin compounds which are preferable as guest compounds to be used in combination with the luminescence-assisting agent of this invention.

General Formula 6:

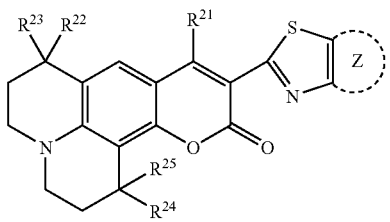

In General Formula 6, $R^{21}$ denotes hydrogen atom or a hydrocarbon group which may bear one or more substituents. Examples of hydrocarbon groups in $R^{21}$ are aliphatic hydrocarbon groups with a carbon number of up to 5, usually 1 to 4, such as methyl, ethyl, propyl, isopropyl, 1-propenyl, 2-propenyl, butyl, isobutyl, sec-butyl, tert-butyl, 2-butenyl and 1,3-butadienyl groups; alicyclic hydrocarbon groups such as cyclopropyl, cyclobutyl, cyclopentyl, cyclohexyl and cyclohexenyl groups; and aromatic hydrocarbon groups such as phenyl, o-tolyl, m-tolyl, p-tolyl, xylyl, mesityl, o-cumenyl, m-cumenyl, p-cumenyl and diphenylyl groups. One or more hydrogen atoms in such hydrocarbon group may be substituted by ether groups such as methoxy, trifluoromethoxy, ethoxy, propoxy, isopropoxy, butoxy, isobutoxy, sec-butoxy, tert-butoxy, pentyloxy, isopentyloxy, phenoxy and benzyloxy groups; ester groups such as acetoxy, trifluoroacetoxy, benzoyloxy, methoxycarbonyl, tri- fluoromethoxycarbonyl, ethoxycarbonyl and propoxycarbonyl groups; and halogen groups such as fluoro, chloro, bromo and iodo groups.

$R^{22}$ to $R^{25}$ in General Formula 6 independently denote hydrogen atom or an aliphatic hydrocarbon group. Aliphatic hydrocarbon groups in $R^{22}$ to $R^{25}$ are, for example, those with a carbon number of up to 5, usually 1 to 4, such as methyl, ethyl, propyl, isopropyl, butyl, isobutyl, sec-butyl and tert-butyl groups. Dependently upon uses, the much more preferable in organic EL devices are coumarin compounds where $R^{22}$ to $R^{25}$ are aliphatic hydrocarbon groups: In particular, those where $R^{22}$ to $R^{25}$ are methyl groups are superior in physical and economical properties.

Z in General Formula 6 denotes an aromatic ring which is in condensation with the thiazole ring. Particular aromatic rings are, for example, monocyclic hydrocarbons such as benzene; condensed polycyclic hydrocarbons such as naphthalene, anthracene, phenanthrene, naphthacene and chrysene; and hydrocarbon ring assemblies such as biphenyl, terphenyl, phenylnaphthalene and naphthylnaphthalene.

Chemical Formulae 32 to 58 exemplify such coumarin compound. These commonly bear a maximum for luminescence such as fluorescence in the visible region and remarkably prolong a constant luminescence in the green to red region over an extended time period when used in organic EL devices.

Chemical Formula 32:

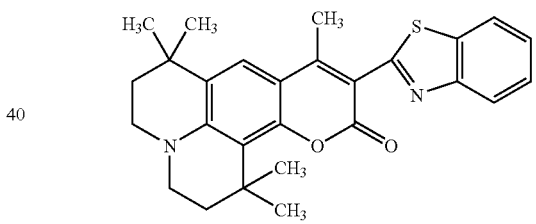

Chemical Formula 33:

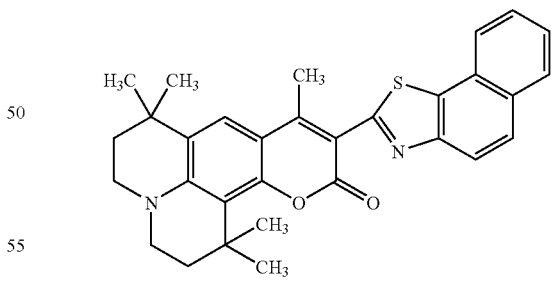

Chemical Formula 34:

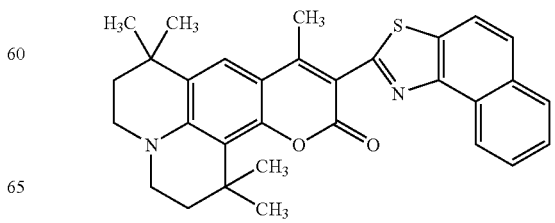

Chemical Formula 35:
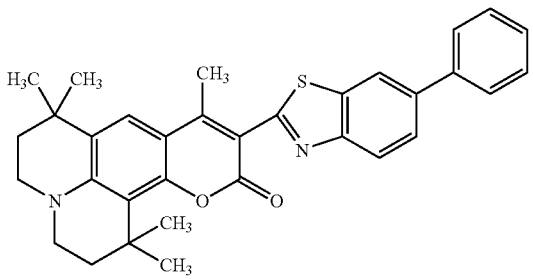
Chemical Formula 36:
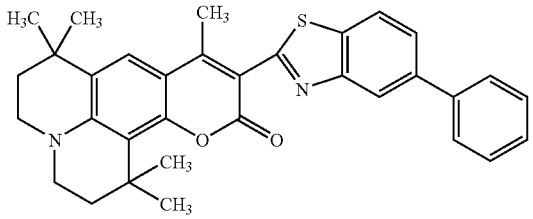
Chemical Formula 37:
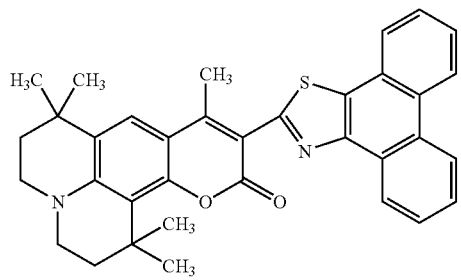
Chemical Formula 38:
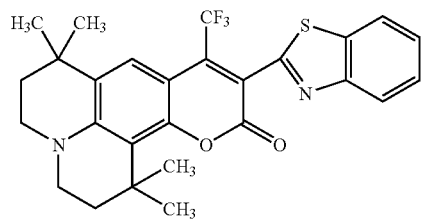
Chemical Formula 39:
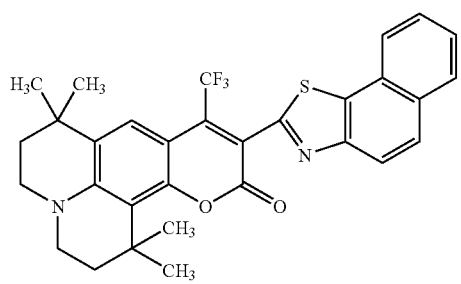
Chemical Formula 40:
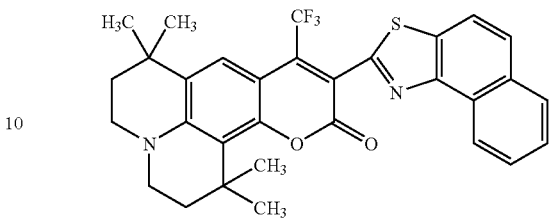
Chemical Formula 41:
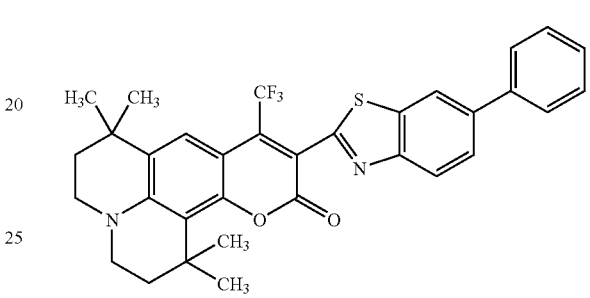
Chemical Formula 42:
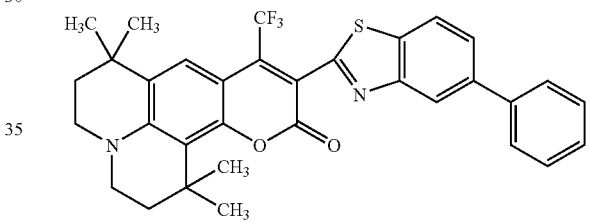
Chemical Formula 43:
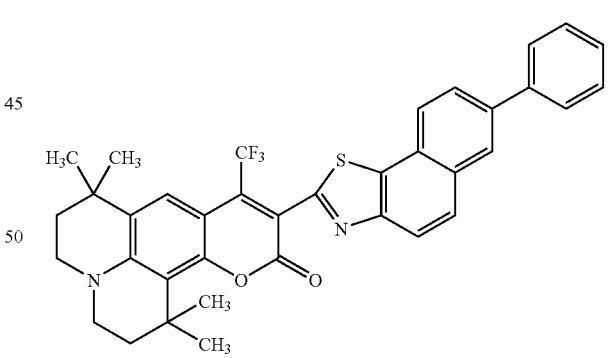
Chemical Formula 44:
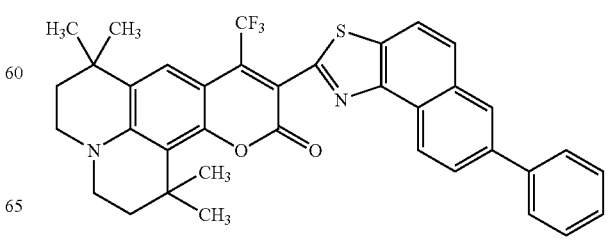

Chemical Formula 45:
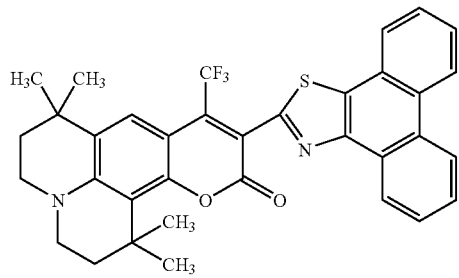
Chemical Formula 46:
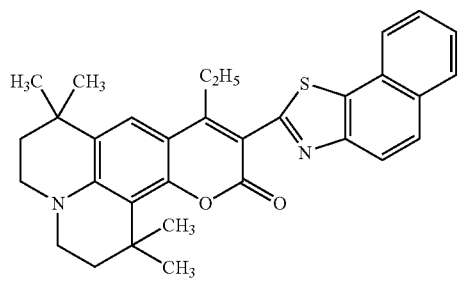
Chemical Formula 47:
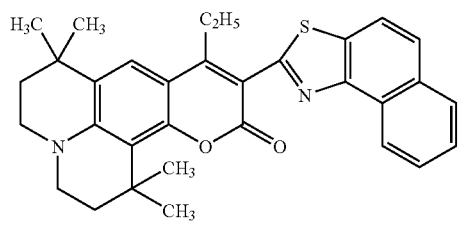
Chemical Formula 48:
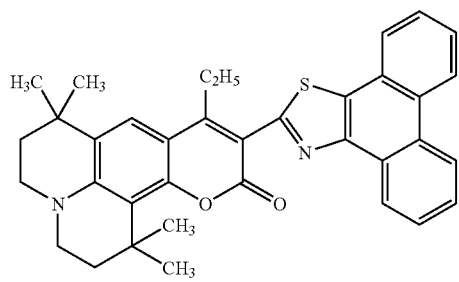
Chemical Formula 49:
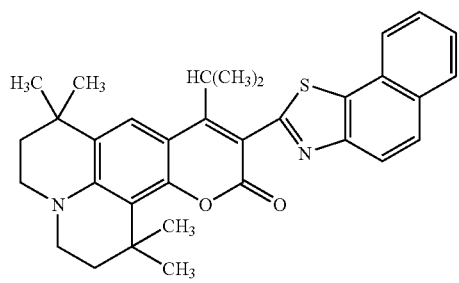
Chemical Formula 50:
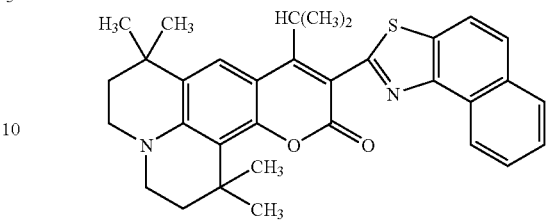
Chemical Formula 51:
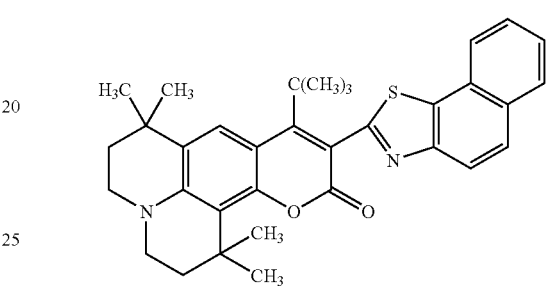
Chemical Formula 52:
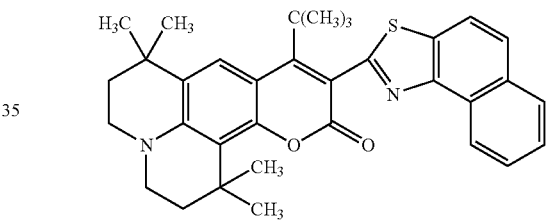
Chemical Formula 53:
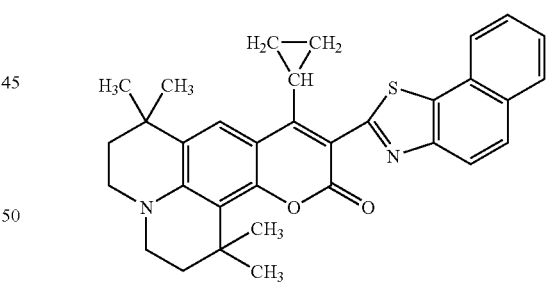
Chemical Formula 54:
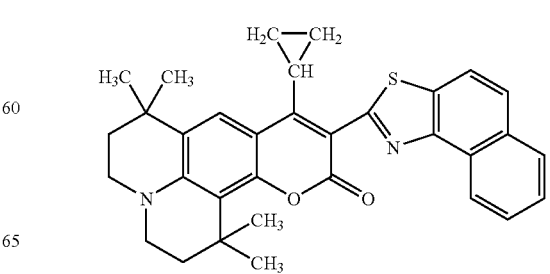

Chemical Formula 55:

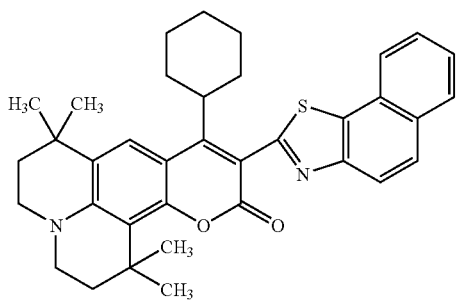

Chemical Formula 56:

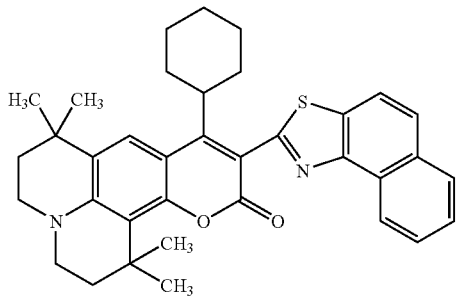

Chemical Formula 57:

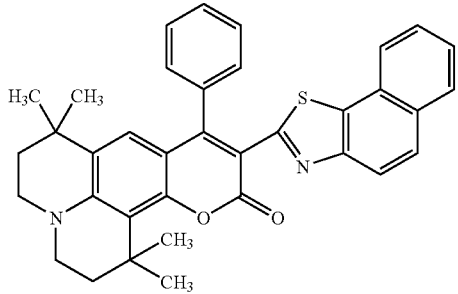

Chemical Formula 58:

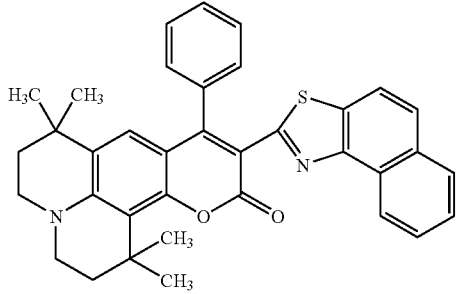

Such coumarin compound can be prepared in various ways: With economical viewpoint, it is preferable to employ the process disclosed in the Specification of Japanese Patent Application No. 2001-26861 (Title of the Invention "Coumarin derivative, process for producing the same, and luminescent agent and luminescent device using the same"); said process including the step of allowing a compound which bears aldehyde and a hydrocarbon group at the 3- and 4-positions in coumarin structure respectively and a julolidine structure at the sites other than the 3- and 4-positions to react with a monocyclic, condensed polycyclic or ring assembly hydrocarbon which bears a thiol group and a primary amino group bound to vicinal carbon atoms. The coumarin derivatives represented by Chemical Formulae 32 to 58 can be obtained in a desired amount with such process. For example, Japanese Patent Kokai No. 2001-76876 illustrates coumarin compounds where $R^{21}$ in General Formula 6 is hydrogen atom.

The reference numeral 5 represents an electron injection/transportation layer, which is usually formed with a method similar to those in the anode 2 by preparing one or more organic compounds high in electron affinity or anthraquinodimethane, anthrone, oxadiazole, carbodiimide, distyrylpyrazine, diphenylquinone, silazane, thiopyrandioxide, triazole, tetracarboxylic acid derivative of heterocyclic compound, phthalocyanine, fluorene derivatives, quinolinol metal complexes similar to those in the luminescent layer 4 or a conductive oligomer or polymer of repeating aniline, thiophene or pyrrole units into a membrane with a thickness of 10 to 500 nm while allowing it to contact with the luminescent layer 4. In case that a plurality of the electron injection/transportation layer materials are used, they may be mixed to homogeneity and then formed into a single layer, and alternatively formed into a plurality of separate layers without premixing while allowing each layer to contact with the adjacent layer(s). In case of providing a hole-blocking layer, a hole-blocking layer material, for example, oxadiazole compound such as 2-biphenyl-4-yl-5-(4-tert-butylphenyl) -1,3,4-oxadiazole, 2,2-bis[5-(4-biphenyl)-1,3,4-oxadiazole -2-yl-1,4-phenylene]hexafluoropropane and 1,3,5-tris -(2-naphthalene-1-yl-[1,3,4]oxadiazole-5-yl)benzen is prepared with a method similar to those in the anode 2 while allowing it to contact with the luminescent layer 4, prior to the formation of the electron injection/transportation layer 5. The thickness of such hole-blocking layer is set to a level in the range of 1 to 100 nm, usually, 10 to 50 nm while considering the thickness of the electron injection/transportation layer 5 and the operation characteristics of organic EL devices.

The reference numeral 6 represents a cathode, which is usually formed by depositing one or combined metals such as lithium, magnesium, calcium, sodium, potassium, silver, copper, aluminium, indium, ytterbium, their alloys and metal oxides and electric conductive compounds with a work function (usually not higher than 5 eV) lower than that for the compound to be used in the electron injection/transportation layer 5 while allowing the resultant layer to come into contact with the electron injection/transportation layer 5. There is provided no limitation for the thickness of the cathode 6: It is set to 10 nm or more thick, desirably, 50-500 nm to give a resistivity of 1 k$\Omega$/☐ or lower while considering electric conductivity, production cost, thickness of device and optical transmittance. There may be provided an interfacial layer of aromatic diamine, quinaqcridone, naphthacene, organic silicon or organic phosphide between the cathode 6 and electron injection/transportation layer 5 in order to improve their adhesion, if necessary. Furthermore, to facilitate the transportation of electrons from the cathode 6 to the injection/transportation layer 5, there may be provided with a method similar to those in the anode 2 a membrane of alkaline metal or alkaline earth metal compound such as lithium fluoride or lithium oxide, 0.1 to 2 nm thick, on the side of contacting to the electron injection/transportation layer 5 in the cathode 6.

As explained heretofore, the organic EL device of this invention can be obtained by providing in one device an anode, luminescent layer, cathode and arbitrarily a hole injection/transportation layer, electron injection/transportation layer and/or hole-blocking layer on the same substrate while allowing each layer to contact with adjacent layer(s). During the formation of each layer, it is desirable to carry out all the working steps under highly vacuumed conditions, particularly, at a pressure of $10^{-5}$ Torr or lower to minimize the oxidation and decomposition of organic compounds, as well as to minimize the adhesion of oxygen and water. In the formation of a luminescent layer, the ratio of host and guest compounds can be adjusted by premixing them in a prescribed ratio, and alternatively by separately controlling the heating velocities for respective compounds in vacuum sublimation. To minimize deterioration under operation conditions, it is desirable either to seal a part or whole of the organic EL device thus obtained with a sealing glass or metallic cap in the stream of an inert gas, or to coat or cover it with a moisture-proof paint or protecting membrane such as those of ultraviolet-setting resins. Dependently upon the structures of organic EL devices, in order to allow the luminescent layer to release a luminescence outside the device in an improved efficiency, one can employ one or combined diffracting means which change the incident angle of the luminescence against the luminescence-releasing plane in the device, for example, bracelet plates and reflection or transmission gratings of one- or two-dimensional type to suppress the total reflection at the interface between the organic and inorganic layers in the devices and/or the luminescence-releasing plane and the air.

Now, explanation is made on the way of using the organic EL device of this invention. The organic EL device is driven by intermittently energizing it with a relatively high pulse voltage, or continuously energizing it with a relatively low non-pulse voltage, usually, 2 to 50 V, dependently upon its uses. The organic EL device of this invention gives a luminescence only when anode potential exceeds cathode potential. Thus, both dc or ac voltages are feasible to energize the organic EL devices of this invention, and the waveform and frequency of such voltages are arbitrary chosen. When energized with ac, the organic EL device of this invention increases and decreases the brightness of luminescence, and repeats on/off for luminescence due to its principle. In case of the organic EL device in FIG. 1, when a voltage is energized between the anode 2 and cathode 6, holes injected from the anode 2 move into the luminescent layer 4 through the electron injection/transformation layer 3, and electrons injected from the cathode 6 move into the luminescence layer 4 through the electron injection/transportation layer 5. As the result, the holes and electrons recouple in the luminescent layer 4, and the prescribed luminescence is released from guest compound molecules in the excited state through the anode 2 and substrate 1. Dependently upon the structures and ratio of host and guest compounds to be used in combination with the coumarin derivative, the organic EL device of this invention has a maximum for luminescence such as fluorescence in the visible region at a wavelength longer than 550 nm, usually, in the orange to red region at a wavelength of 580 to 780 nm. The x value for such luminescence is usually in the range of 0.30 to 0.73, and the y value, in the range of 0.10 to 0.60 on the xy chromaticity diagram established by the Commission International de l'Eclairage (CIE).

The organic EL device of this invention would find a variety of uses in illuminants and information displaying equipments to visualize informations because it is superior in durability, high in emission efficiency and as the result easy to elevate its brightness. Particularly, since the illuminants using the organic EL device of this invention as light source can be formed into a light panel with a reduced power consumption, they are very useful in illuminants in general, as well as energy- and space-saving lighting source or information displaying device, for example, those in liquid crystal devices, copying apparatuses, printing apparatuses, electronic photographic apparatuses, computers and application apparatuses, controlling instruments directed to industrial uses, electronic measuring apparatuses, analyzing apparatuses, measuring instruments in general, communicating apparatuses, electronic measuring instruments directed to uses in medical treatment, electronic equipments in general which are directed to uses at home or professional uses, cars, automobiles, ships, airplanes, spaceships, aircraft controlling apparatuses, interiors, signboards and signs. In case that the organic EL device in this invention is used as displaying means in information displaying equipments such as measuring instruments to be equipped to cars, automobiles, ships, aircrafts and spaceships, computers, televisions, video recorders, computerized game consoles, clocks, calculators, telephones, telecommunicating apparatuses, car navigation systems, osilloscopes, radars, sonars, signs and signboards, it may be driven by applying thereto with a driving circuit of conventional simple or active matrix type which is usual in this art while combining with other organic EL devices which release a visible luminescnce in the blue, green or red region, and/or appropriate filters which are to control luminescent chromaticity and color tone, if necessary.

Several embodiments according to this invention will be explained with reference to Examples:

EXAMPLE 1

Luminescence-Assisting Agent for Use in Organic EL Device

An adequate amount of dimethylsulfoxide was placed in a reaction vessel and mixed with 0.21 g of the compound represented by Chemical Formula 59 and 0.21 g of the compound represented by Chemical Formula 60. The mixture was refluxed for two hours, cooled to ambient temperature and admixed with an adequate amount of methanol, followed by collecting the resultant crystals by filtration. The crystals were purified on column chromatography using a mixture of chloroform and ethyl acetate as eluent to obtain the coumarin derivative of this invention represented by Chemical Formula 18 in 0.2 g orange crystals.

Chemical Formula 59:

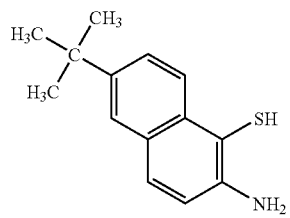

Chemical Formula 60:

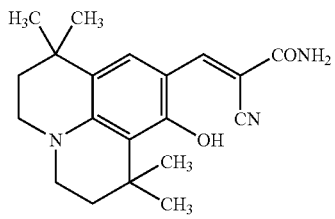

A part of the crystals was sampled, and analyzed in usual manner, revealing that the coumarin derivative in this Example showed a melting point of 345 to 351° C. The visible absorption and fluorescence emission spectra in methylene chloride solution showed an absorption maximum($\epsilon$=5.8×10$^4$) and a fluorescent maximum at wavelengths of 491 and 518 nm respectively when determined in usual manner. The $^1$H-nuclear magnetic resonance spectrum (abbreviated as "$^1$H-NMR spectrum" hereinafter) in chloroform deuteride solution showed peaks at chemical shifts δ (ppm, TMS) of 1.37 (6H,s), 1.56 (9H, s), 1.62 (6H, s), 1.79 (2H, s), 1.85(2H, s), 3.30 (2H, t), 3.39 (2H, s), 7.40 (1H, s), 7.67 (1H, dd), 7.73 (1H, d), 7.90 (1H, d), 7.91 (1H, d), 8.91 (1H, s) and 9.02 (1H, s) when determined in usual manner.

Another part of the crystals was sampled and subjected to usual DSC analysis using a commercially available DSC analyzing system, Trade name of "Model DSC 220U", a product of Seiko Instruments Incorporated., leading to a glass transition point at 151° C. Simultaneously, the conventional analogous compound represented by Chemical Formula 34 where the naphtothiazole ring beared no hydrocarbon group was determined for its glass transition point (129° C.) similarly as above. Although the analogous compound represented by Chemical Formula 61 was significantly lower in solubility in organic solvents such as acetone and chloroform in comparison with the coumarin derivative represented by Chemical Formula 18 according to this invention, the analogous compound exhibited a luminescent maximum in a wavelength region similar to that in the coumarin derivative represented by Chemical Formula 18.

Chemical Formula 61:

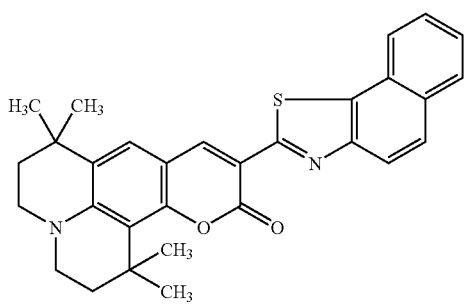

As well known, glass transition point is one of the important merkmals which are to estimate the thermal stability of organic compounds: It has been documented that a compound with a higher glass transition point marks a larger thermal stability. The above experimental results show that the coumarin derivative of this invention, which has a condensed naphthalene ring linked with one or more hydrocarbon groups in the molecule, remarkably improves the thermal resistance of conventional analogous compounds without substantially changing their desirable optical properties.

The coumarin derivative of this Example is useful as luminescence-assisting agent because it exhibits an improved thermal resistance and accelerates the transfer of energy from host compound to guest compound.

EXAMPLE 2

Luminescence-Assisting Agent for Use in Organic EL Device

The compound represented by Chemical Formula 62 in place of the compound represented by Chemical Formula 59 was allowed to react in accordance with the method in Example 1 to obtain the coumarin derivative represented by Chemical Formula 24 according to this invention.

Chemical Formula 62:

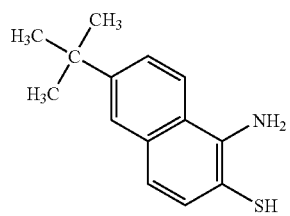

The coumarin derivative of this Example is useful as luminescence-assisting agent because it exhibits an improved thermal resistance and accelerates the transfer of energy from host compound to guest compound.

EXAMPLE 3

Luminescence-Assisting Agent for Use in Organic EL Device

The compounds represented by Chemical Formulae 63 and 64 in place of those represented by Chemical Formulae 59 and 60 respectively were allowed to react in accordance with the method in Example 1 to obtain the coumarin derivative of this Example represented by Chemical Formula 12.

Chemical Formula 63:

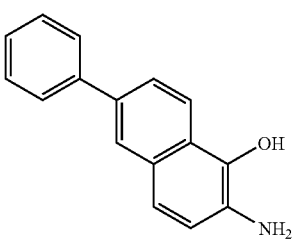

Chemical Formula 64:

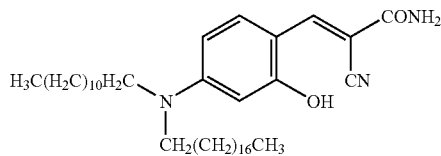

The above coumarin derivative of this Example is useful as luminescence-assisting agent because it exhibits an improved thermal resistance and accelerates the transfer of energy from host compounds to guest compounds.

EXAMPLE 4

Luminescence-Assisting Agent for Use in Organic EL Device

The compounds represented by Chemical Formulae 65 and 64 in place of those represented by Chemical Formulae 59 and 60 respectively were allowed to react in accordance with the method of Example 1 to obtain the coumarin derivative represented by Chemical Formula 11 according to this invention.

Chemical Formula 65:

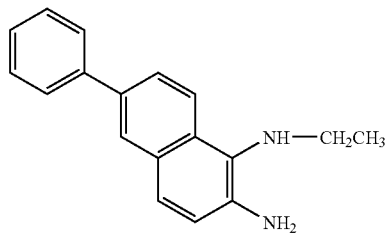

The coumarin derivative of this Example is useful as luminescence-assisting agent because it exhibits an improved thermal resistance and accelerates the transfer of energy from host compound to guest compound.

EXAMPLE 5

Luminescence-Assisting Agent for Use in Organic EL Device

The compounds represented by Chemical Formulae 66 and 67 in place of those represented by Chemical Formulae 59 and 60 respectively were allowed to react in accordance with the method in Example 1 to obtain the coumarin derivative represented by Chemical Formula 2 according to this invention.

Chemical Formula 66:

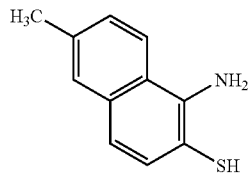

Chemical Formula 67:

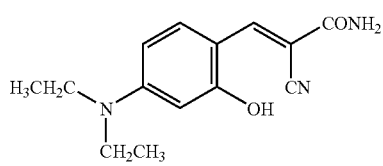

The coumarin derivative of this Example is useful as luminescence-assisting agent because it exhibits an improved thermal resistance and accelerates the transfer of energy from host compound to guest compound.

EXAMPLE 6

Luminescence-Assisting Agent for Use in Organic EL Device

A 50 ml aliquot of N,N-dimethylformamide was placed in a reaction vessel and mixed with 13.4 g of the compound represented by Chemical Formula 68 and 11.0 g of the compound represented by Chemical Formula 59. The mixture was refluxed for two hours, cooled to ambient temperature and admixed with an adequate amount of methanol, followed by collecting the resultant crystals by filtration. The crystals were purified on column chromatography using chloroform as eluent to obtain the coumarin derivative represented by Chemical Formula 20 according to this invention.

Chemical Formula 68:

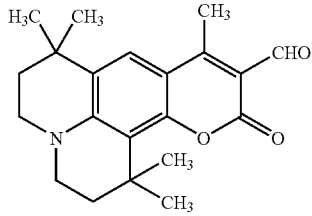

A part of the crystals was sampled and analyzed in usual manner, revealing that the coumarin derivative in this Example showed a melting point of 251 to 254° C. DSC analysis carried out in Example 1 led a glass transition point at 131° C. The visible absorption and fluorescence emission spectra in methylene chloride solution showed an absorption maximum($\epsilon=4.2\times10^4$) and a fluorescent maximum at respective wavelengths of 453 and 519 nm when determined in usual manner. The $^1$H-NMR spectrum in chloroform deuteride solution showed peaks at chemical shifts δ (ppm, TMS) of 1.37 (6H, s), 1.50 (9H, s), 1.57 (6H, s), 1.78 to 1.87 (4H, m), 3.11 (4H, m), 3.25 to 3.29 (2H, m), 3.34 to 3.38 (2H, m), 7.57 (1H, s), 7.66 (1H, dd), 7.75 (1H, d), 7.89 to 7.94 (2H, m) and 8.84 (1H, s) when determined in usual manner.

The coumarin derivative of this Example is useful as luminescence-assisting agent because it exhibits an improved thermal resistance and accelerates the transfer of energy from host compound to guest compound.

EXAMPLE 7

Luminescence-Assisting Agent for Use in Organic EL Device

Either of six distinct coumarin derivatives, obtained by the methods in Examples 1 to 6, was placed in a water-cooled sublimation apparatus and then heated in usual manner while keeping the inner space of the apparatus at a reduced pressure to effect sublimation purification.

The coumarin derivatives in this Example are useful in organic EL devices which need a highly purified luminescence-assisting agent.

Although the coumarin derivatives feasible in this invention, including those represented by Chemical Formulae 1 to 27 but not specifically illustrated in Examples 1 to 7, are slightly different in starting reaction conditions and yields dependently on their structures, they can be obtained by the methods in Examples 1 to 7 or in accordance therewith.

EXAMPLE 8

Organic EL Device

A multi-layered organic EL device with the structure of FIG. 1 was prepared with the luminescence-assisting agent according to this invention: A glass substrate with a transparent ITO electrode, 160 nm thick, was patterned with a hydrobromic acid in usual manner, washed with organic alkali detergent, refined water, acetone and ethanol in the given order under ultrasonical conditions, dried, aerated with ultraviolet ozone to remove organic impurities on the surface of ITO electrode, and transferred to the pretreatment room in a vacuum depositing apparatus. The pretreatment room was then reduced to an inner pressure of $1\times10^{-6}$ Torr, injected with a mixture of argon and oxygen gases to give an inner pressure of $1\times10^{-2}$ Torr, and subjected to plasma treatment, thus obtaining a clean substrate 1 with ITO electrode as the cathode 2.

The substrate 1 was transferred to the organic vaporizing room in the vacuum depositing apparatus which had been reduced to an inner pressure of $5\times10^{-7}$ Torr, while the surface of ITO electrode as the cathode 2 was attached with an organic membrane-forming mask, after which the carbon crucible was heated to deposit the copper phthalocyanine represented by Chemical Formula 69 and triphenylamine tetramer represented by Chemical Formula 70 (abbreviated as "TPTE" hereinafter) as the hole injection/transportation layer materials in this order to give respective thickness of 10 and 30 nm, thus forming the hole injection/transportation layer 3. Subsequently, TPTE as host compound, the pyran compound represented by Chemical Formula 28 as guest compound and either of the coumarin derivatives represented by Chemical Formula 18 or 20 as luminescence-assisting agent according to this invention, obtained by the method of Example 1 or 6, were simultaneously deposited in a weight ratio of 100:1:3 to form the luminescent layer 4, thickness of 20 nm while allowing it to contact with the hole injection/transportation layer 3, after which Tris(8-quinolinolate) aluminium was deposited to form the electron injection/transportation layer 5, thickness of 60 nm while allowing it to contact with the luminescent layer 4.

Chemical Formula 69:

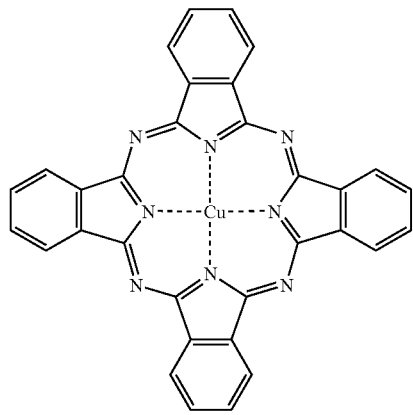

Chemical Formula 70:

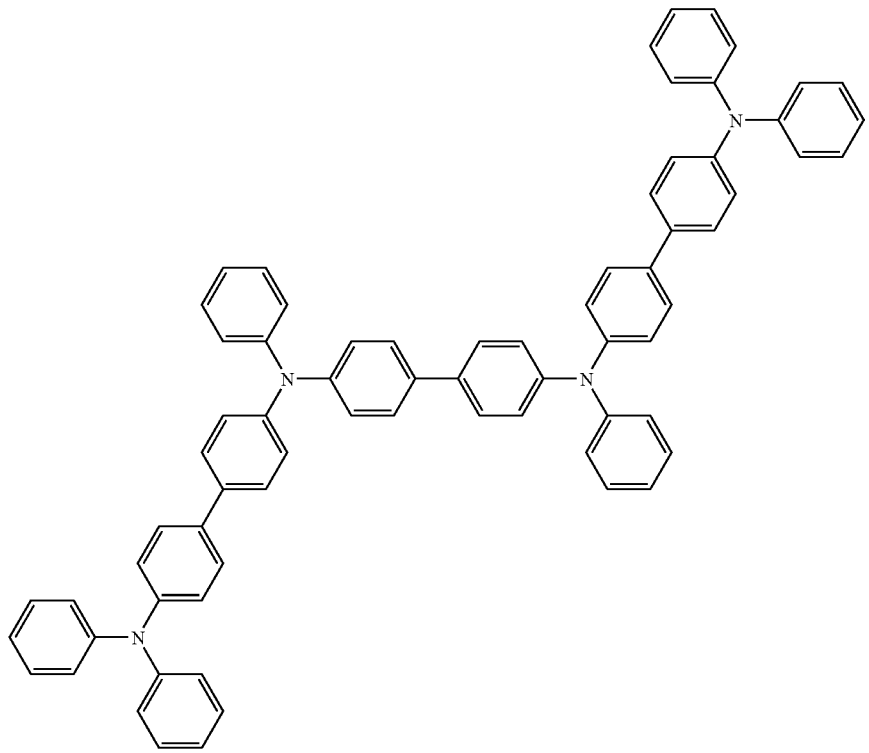

Thereafter, the substrate 1 was transferred to the metal-depositing room in the vacuum depositing apparatus, deposited with lithium fluoride and aluminium in this order to give respective thicknesses of 0.5 and 150 nm to form the anode 6 while allowing it to contact with the electron injection/transportation layer 5, after which the resultant was sealed with a glass plate and ultraviolet-setting resin under nitrogen-aerating conditions, thus obtaining an organic EL device.

Separately, an additional organic EL device as control for comparison was prepared similarly as in the above except that the coumarin derivative represented by Chemical Formula 18 or 20 according to this invention was omitted. Three types of organic EL devices thus obtained were determined in usual manner for electroluminescent properties and life expectancy (or a driving time to halve initial brightness). The results were as shown in Table 1.

wavelength of around 600 nm, as well as an approximately the same chromaticity: In the organic EL devices in this Example, the x value in color coordinates on the xy chromaticity diagram established by the CIE was in the range of 0.53 to 0.55; and the y value, in the range of 0.42 to 0.44, while in the control organic EL device, the x value was 0.56; and the y value, 0.41. This indicates that the coumarin derivatives of this invention used in the luminescent layer 4 are not responsible for luminescence.

However, as seen in Table 1, the organic EL devices in this Example gave at ambient temperature a luminescent brightness of 551 to 574 cd/m$^2$, a power and current efficiencies exceeding 3 lm/W and 5 cd/A respectively when driven with a constant current of 11 mA/cm$^2$. While the control organic EL device was significantly inferior to the organic EL devices in this Example in luminescent brightness (523 cd/m$^2$) when driven with a constant current of 11

TABLE 1

| Luminescence-assisting agent | Wavelength of luminescent maximum (nm) | A | B | C | D | Chromaticity diagram (x, y) | Remarks |
|---|---|---|---|---|---|---|---|
| Chemical Formula 18 | 596 | 551 | 5.01 | 3.28 | 268 | (0.55, 0.42) | Present invention |
| Chemical Formula 20 | 596 | 574 | 5.22 | 3.37 | 418 | (0.53, 0.44) | Present invention |
|  | 596 | 523 | 4.75 | 2.26 | 141 | (0.56, 0.41) | Control |

Note:
The symbols "A", "B", "C", and "D" mean "Luminescent brightness (cd/m$^2$)", "Current efficiency (cd/A)", "Power efficiency (lm/W)", and "Life expectancy (hour)", respectively.

As seen from the results in Table 1, the organic EL devices in this Example and control organic EL device commonly exhibited a luminescent maximum in the orange region at a mA/cm$^2$ at ambient temperature, and its power and current efficiencies were significantly lower (2.26 lm/W and 4.75 cd/A respectively) than those in the organic EL devices in this Example. As to life expectancy, the organic EL devices in this Example gave prolonged expectancies (268 to 418 hours) when set the initial brightness to 2,400 cd/m$^2$ and driven at ambient temperature with a constant current, while the control organic EL device was significantly shorter in life expectancy (141 hours) than those in this Example when tested similarly as above. In the organic EL devices in this example, the electroluminescence consistently prolonged and non-luminescent parts such as dark spot were observed throughout the test.

These results show that the luminescent efficiency and life expectancy in organic EL devices can be effectively improved without substantially changing desirable luminescent properties of guest compounds by using the coumarin derivatives of this invention as luminescence-assisting agent in combination with TPTE, a type of hole injection/transportation layer material.

EXAMPLE 9

Organic EL Device

An organic EL device was prepared similarly as in Example 8 by using the coumarin derivative represented by Chemical Formula 18 according to this invention as luminescence-assisting agent except that the coumarin compound represented by Chemical Formula 39 was used as guest compound in place of the coumarin derivative represented by Chemical Formula 28.

Separately, an additional organic EL device as control for comparison was prepared without using the coumarin derivative of this invention. Two types of organic EL devices thus obtained were determined in usual manner for electroluminescent properties and life expectancy. The results were as shown in Table 2.

maticity diagram established by the CIE was 0.40; and the y value, 0.55, while in the control organic EL device, the x value was 0.38; and the y value, 0.54. This indicates that the coumarin derivative of this invention used in the luminescent layer 4 is not responsible for luminescence.

However, as seen in Table 2, the organic EL device in this Example gave at ambient temperature a luminescent brightness, power and current efficiencies similar to those in the control when driven with a constant current of 11 mA/cm$^2$: The organic EL device in this example was significantly longer in life expectancy (38.2 hours) than that (28.2 hours) in the control when set the initial brightness to 2,400 cd/m$^2$ and driven with a constant current. In the organic EL device in this Example, the electroluminescence consistently prolonged and non-luminescent parts such as dark spot were observed throughout the test.

These results show that the luminescent efficiency and life expectancy in organic EL devices can be effectively improved without substantially changing desirable luminescent properties of guest compounds by using the coumarin derivative of this invention as luminescence-assisting agent in combination with guest compound such as TPTE.

EXAMPLE 10

Organic EL Device

Organic EL devices were prepared similarly as in Example 8 except that aluminium tris(8-quinolinolate) as host compound and the coumarin compound represented by Chemical Formula 39 as guest compound were used in place of TPTE and the compound represented by Chemical Formula 28 respectively.

TABLE 2

| Luminescence-assisting agent | Wavelength of luminescent maximum (nm) | A | B | C | D | Chromaticity diagram (x, y) | Remarks |
|---|---|---|---|---|---|---|---|
| Chemical Formula 18 | 597 | 252 | 2.29 | 1.28 | 38.2 | (0.40, 0.55) | Present invention |
|  | 598 | 251 | 2.29 | 1.26 | 28.2 | (0.38, 0.54) | Control |

Note:
The symbols "A", "B", "C", and "D" mean "Luminescent brightness (cd/m$^2$)", "Current efficiency (cd/A)", "Power efficiency (lm/W)", and "Life expectancy (hour)", respectively.

As seen from the results in Table 2, the organic EL device in this Example and control organic EL device commonly exhibited a luminescent maximum in the orange region at a wavelength of around 600 nm, as well as an approximately the same chromaticity: In the organic EL device in this example, the x value in color coordinates on the xy chro- Separately, an additional organic EL device as control for comparison was prepared without using the coumarin derivative of this invention. Three types of organic EL devices thus obtained were determined in usual manner for electroluminescent properties and life expectancy. The results were as shown in Table 3.

TABLE 3

| Luminescence-assisting agent | Wavelength of luminescent maximum (nm) | A | B | C | D | Chromaticity diagram (x, y) | Remarks |
|---|---|---|---|---|---|---|---|
| Chemical Formula 18 | 612 | 338 | 3.07 | 1.84 | 13 | (0.53, 0.45) | Present invention |
| Chemical Formula 20 | 612 | 373 | 3.39 | 1.75 | 14 | (0.50, 0.47) | Present invention |
|  | 614 | 274 | 2.49 | 1.30 | 8 | (0.52, 0.45) | Control |

Note:
The symbols "A", "B", "C", and "D" mean "Luminescent brightness (cd/m$^2$)", "Current efficiency (cd/A)", "Power efficiency (lm/W)", and "Life expectancy (hour)", respectively.

As seen from the results in Table 3, the organic EL devices in this Example and control organic EL device commonly exhibited a luminescent maximum in the orange region at a wavelength of around 610 nm, as well as an approximately the same chromaticity: In the organic EL devices in this example, the x value in color coordinates on the xy chromaticity diagram established by the CIE was in the range of 0.50 to 0.53; and the y value, in the range of 0.45 to 0.47, while in the control organic EL device, the x value was 0.52; and the y value, 0.45. This indicates that the coumarin derivative of this invention used in the luminescent layer 4 are not responsible for the luminescence.

However, as seen in Table 3, the organic EL devices in this Example gave at ambient temperature a luminescent brightness of 338 to 373 cd/m$^2$, a power and current efficiencies exceeding 1.7 lm/W and 3 cd/A respectively when driven with a constant current of 11 mA/cm$^2$. While the control organic EL device was significantly inferior to the organic EL devices in this Example in luminescent brightness (274 cd/m$^2$) when driven under the same conditions as above, and its power and current efficiencies were significantly lower (1.31 m/W and 2.49 cd/A respectively) than those in the organic EL devices. As to life expectancy, the organic EL devices in this Example gave prolonged expectancies (13 to 14 hours) when set the initiation brightness to 2,400 cd/m$^2$ and driven at ambient temperature with a constant current, while the control organic EL device was significantly shorter in life expectancy (8 hours) than those in this Example when tested similarly as above.

These results show that the luminescent efficiency and life expectancy in organic EL devices can be effectively improved without substantially changing desirable luminescent properties of guest compounds by using the coumarin derivatives of this invention as luminescence-assisting agent in organic EL devices in combination with quinolinol metal complexes, a type of electron injection/transportation layer material. The results of Example 8 to 10 indicate that practically useful organic EL devices can be prepared by using the luminescence-assisting agent of this invention in combination with such host and guest compounds, regardless of their carrier transportation properties.

EXAMPLE 11

Organic EL Device

An clean substrate 1 which had been prepared similarly as in Example 8 was transferred to the organic vaporizing room in the vacuum depositing apparatus which had been reduced to an inner pressure of 5×10$^{-7}$ Torr, while the surface of ITO electrode as the cathode 2 was attached with an organic membrane-forming mask, after which the carbon crucible was heated, thus forming the hole injection/transportation layer 3. Subsequently, the first luminescent layer comprising TPTE as host compound, the pyran compound represented by Chemical Formula 28 as guest compound and the coumarin derivative as luminescence-assisting agent represented by Chemical Formula 18 according to this invention was formed similarly as in Example 8, after which the compounds represented by Chemical Formulae 71 and 72 were deposited to form the second luminescent layer, and aluminium tris (8-quinolinolate) was then deposited to form the third luminescent layer with electron injection/transportation properties.

Chemical Formula 71:

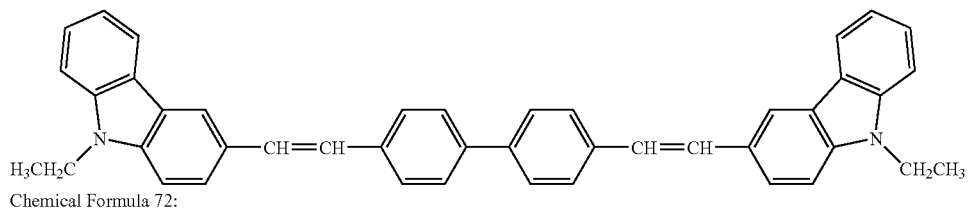

Chemical Formula 72:

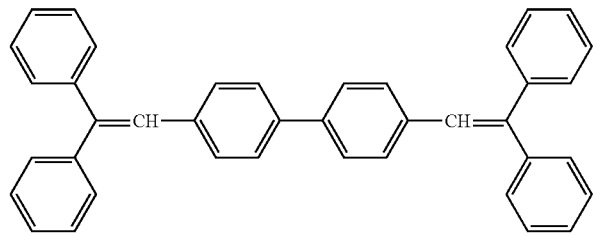

Thereafter, the substrate 1 was transferred to the metal-depositing room in the vacuum depositing apparatus, deposited with lithium fluoride and aluminium in this order similarly as in Example 8 to form the anode 6, after which the resultant was sealed with a glass plate and ultraviolet-setting resin under nitrogen-aerating conditions, thus obtaining an organic EL device.

Separately, an additional organic EL device as control for comparison was prepared similarly as in the above except that the coumarin derivatives according to this invention was omitted. Two types of organic EL devices thus obtained were determined in usual manner for electroluminescent properties and life expectancy. The results were as shown in Table 4.

TABLE 4

| Luminescence-assisting agent | Wavelength of luminescent maximum (nm) | A | B | C | D | Chromaticity diagram (x, y) | Remarks |
|---|---|---|---|---|---|---|---|
| Chemical Formula 18 | 470, 515, 595 | 1,198 | 7.4 | 3.4 | 11,000 | (0.33, 0.36) | Present invention |
|  | 472, 515, 591 | 1,001 | 6.8 | 3.1 | 6,000 | (0.27, 0.41) | Control |

Note:
The symbols "A", "B", "C", and "D" mean "Luminescent brightness (cd/m$^2$)", "Current efficiency (cd/A)", "Power efficiency (lm/W)", and "Life expectancy (hour)", respectively.

As seen from the results in Table 4, the organic EL device in this Example and control organic EL device commonly exhibited respective luminescent maxima in the blue, green and orange regions at wavelengths of 470, 515 and 600 nm respectively which were mixed to give a visible light emission in the white region. The organic EL device in this Example was superior in chromaticity to those of the control: In the organic EL device in this Example, the x value in color coordinates on the xy chromaticity diagram established by the CIE was 0.33; and the y value, 0.36, while in the control organic EL device, the x value was 0.27; and the y value, 0.41.

As seen in Table 4, the organic EL device in this Example gave at ambient temperature a luminescent brightness of 1,198 cd/m$^2$, a power and current efficiencies of 3.4 lm/W and 7.4 cd/A respectively when driven with a constant current of 11 mA/cm$^2$. While luminescent brightness and power and current efficiency in the control organic EL device were slightly lower (1,001 cd/m$^2$, 3.1 lm/W and 6.8 cd/A respectively) than that in the organic EL device in this Example. As to life expectancy, the organic EL device in this Example gave a prolonged expectancy (11,000 hours) when set the initial brightness to 300 cd/m$^2$ and driven at ambient temperature with a constant current, while the control organic EL device was significantly shorter in life expectancy (6,000 hours) than that in this Example when tested similarly as above.

These results show that the luminescent efficiency and life expectancy in organic EL devices can be effectively improved without substantially changing desirable luminescent properties of guest compounds by using the coumarin derivatives of this invention as luminescence-assisting agent in organic EL devices.

EXAMPLE 12

Display Panel

Figure 2:
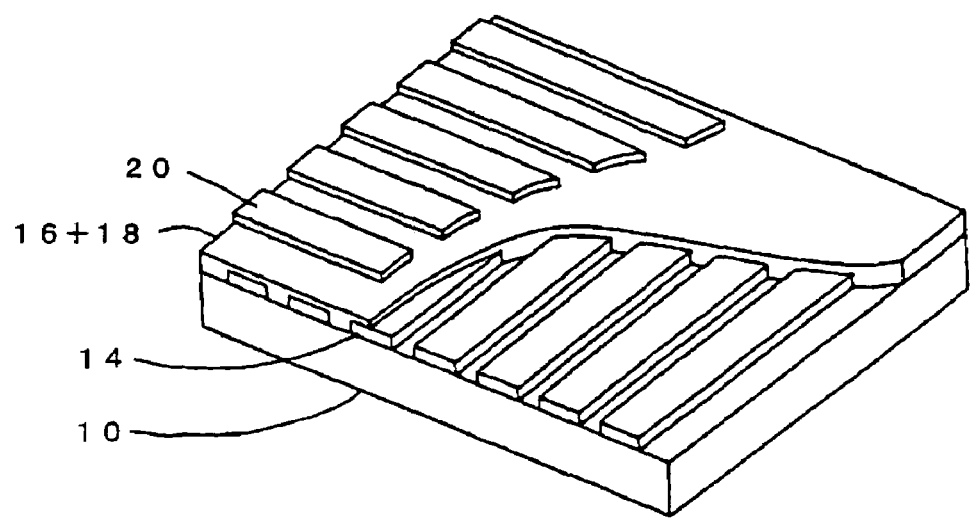
FIG. 2 is a brief figure of an example for display panel according to this invention.

FIG. 2 is a brief figure of a single matrix type display panel (20 stripes of electrodes in the horizontal direction and 30 stripes of electrodes in the vertical direction) which comprises the organic EL device of this invention as substantial element: Such display panel can be prepared as follows.

The anode 14 of transparent ITO electrode is formed on one side of the glass substrate 10 in accordance with the method in Example 8, and then striped by the wet-etching method. The hole injection/transportation layer 16 and luminescent layer 18 are formed in this order in accordance with the method in Example 8, and the cathode 20 is striped with a mechanical mask, followed by sealing the organic EL device with a glass plate (not given in the Figure) and ultraviolet-setting resin. In the display panel of this Example, heat radiating means such as heat-radiating plate and cooling fan may be provided on the backside of the cathode 20.

EXAMPLE 13

Information Displaying Equipment

Figure 3:
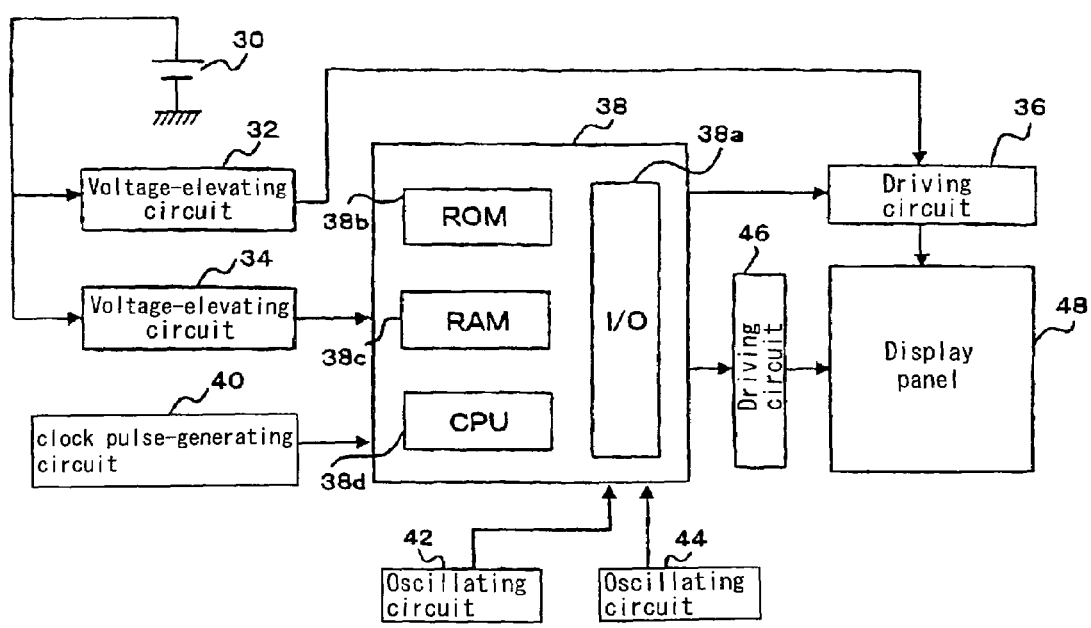
FIG. 3 is a block diagram of an example for information displaying equipment according to this invention.

FIG. 3 is a block diagram of an information displaying equipment which uses a display panel prepared by the method in Example 12. In FIG. 3, the reference numeral 30 represents a dc source, output voltage of 4.5 V, and its output terminals are connected with a pair of voltage-elevating circuits 32 and 34. The voltage-elevating circuit 32 is to supply a dc voltage of 5 to 12 V, and its output terminals are connected with the driving circuit 36. The other voltage-elevating circuit 34 is to supply a constant voltage of 5 V to the microcomputer 38.

The microcomputer 38 comprises the I/O interface 38a for exchanging signals with external sites, the ROM 38b for recording computer programs, the RAM 38c for recording data, and the CPU 38d for carrying out a variety of operations. To the microcomputer 38 is connected the clock pulse-generating circuit 40 for supplying 8 MHz clock signal and the oscillating circuits 42 and 44 which are to supply 5 to 50 Hz signal to control the displaying speed and 0.2 to 2 kHz signal to control the scanning frequency respectively.

The reference numeral 48 represents a display panel comprising the organic EL device of this invention as substantial element, which is connected with the microcomputer 38 through the driving circuits 36 and 46. The driving circuit 36 is to regulate the energization of dc voltage from the voltage-elevating circuit 32 to the display panel 48, which comprises a plurality of transistors connected with either stripe of electrode in the vertical direction in the display panel 48. Thus, when either transistor in the driving circuit 36 is turned on, the stripes of electrode in the vertical direction connected with the transistor is energized with the voltage from the voltage-elevating circuit 32. While the driving circuit 46 comprises a plurality of transistors connected with either stripe of electrode in the horizontal direction in the display panel 48, and when either transistor in the driving circuit 46 is turned on, the stripe of electrode in the horizontal direction connected with the transistor is grounded.

Since the information displaying equipment in this Example is assembled in this way, when one transistor in the driving circuits 36 and another transistor in the driving circuit 46 are turned on in accordance with the instruction of the microcomputer 38, a prescribed voltage is energized between corresponding stripes of electrodes in both vertical and horizontal directions in the display panel 48 to allow the organic EL device at the intersection to release a luminescence. Because of this, for example, when one stripe of electrode in the horizontal direction is chosen by appropriately controlling the driving circuit 36, the transistors connected with respective stripes of electrode in the vertical direction are sequentially turned on while grounding the former stripe of electrode: Thus, the chosen stripe of electrode in the horizontal direction is wholly scanned to display a prescribed picture element. A whole picture can be displayed by sequentially repeating such scanning in the vertical direction. Since the driving circuit 36 in this Example has a resistor which can supply a data enough to operate one stripe of electrode, it is desirable to drive transistors with the data recorded therein.

The information to be displayed is externally supplied in accordance with displaying rate and frequency, and alternatively supplied with data from the ROM 38b where informations with prescribed patterns such as those in words has been recorded in the ROM38b. In case of displaying television broadcast in the usual NTSC mode, the received signals are separated into horizontal and vertical synchronizing signals in correspondence with the horizontal and vertical frequencies according to the broadcasting standard, and the image signals are converted into digital signals which meet to the pixel number in the display panel 48. Television broadcasts can be displayed on the display panel 48 by supplying these signals to the microcomputer 38 while appropriately synchronizing the signals.

INDUSTRIAL APPLICABILITY

As explained heretofore, this invention is based on the creation of a novel coumarin derivative, as well as on the discovery of its properties useful in industries. The coumarin derivative according to this invention effectively accelerates in organic EL devices the transfer of excited energy in host compound to guest compound, and as the result realizes an organic EL device which is superior in a color purity, luminescent efficiency and life expectancy when used in combination with appropriate host and guest compounds. The organic EL device of this invention is advantageously usable in illuminants in general and also in a variety of information displaying equipments to visualize informations, for example, those in images and words because it is superior in luminescent efficiency and durability.

This invention with such outstanding effects is a significant invention which would greatly contribute to this art.

The invention claimed is:
1. An organic electroluminescent device which comprises:
   (a) a host compound;
   (b) a guest compound; and
   (c) a coumarin derivative represented by either General Formula 1 or 2 as a luminescence-assisting agent, said luminescence-assisting agent accelerating the transfer of excited energy in said host compound to said guest compound without giving luminescence;
wherein the ratio of said guest compound to said host compound is 0.1 to 10 mol %, and the ratio of said luminescence-assisting agent to said guest compound is 0.1:10 to 10:0.1 in terms of molar ratio:

General Formula 1:

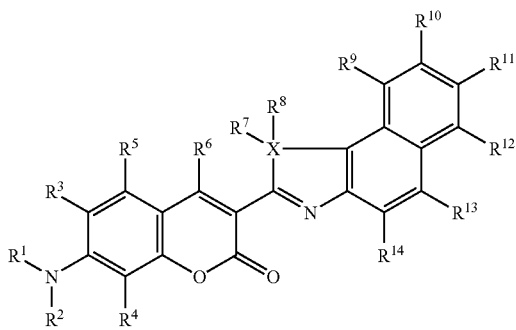

General Formula 2:

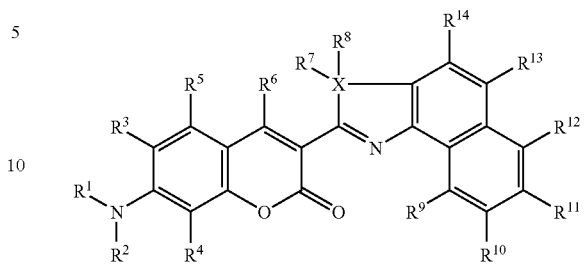

wherein in General Formulae 1 and 2, X denotes a carbon atom or a heteroatom; $R_1$ to $R_{14}$ independently denote hydrogen atom or an arbitrary substituent, provided that $R_3$ and/or $R_4$ are absent when $R_1$ and/or $R_2$ form a ring structure containing both the nitrogen atom linked with $R_1$ and/or $R_2$ and the carbon atom liked with $R_3$ or $R_4$; at least one of $R_9$ to $R_{12}$ is a hydrocarbon group which may bear a substituent; and in the case that X is a divalent or trivalent heteroatom, $R_7$ and/or $R_8$ are absent.

2. The organic electroluminescent device of claim 1, wherein said coumarin derivative is represented by either General Formula 3 or 4:

General Formula 3:

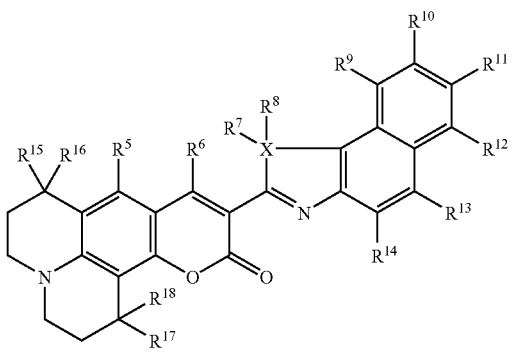

General Formula 4:

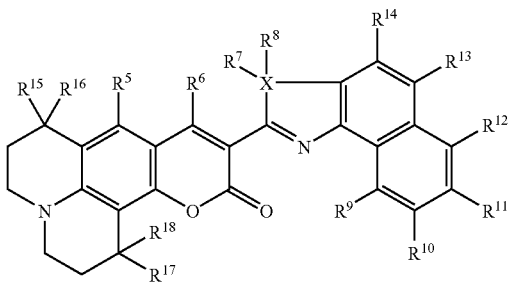

wherein in General Formulae 3 and 4, X denotes a carbon atom or a heteroatom similarly as in General Formula 1 or 2; $R_5$ to $R_{14}$ independently denote a hydrogen atom or a substituent similarly as in General Formula 1 or 2; at least one of $R_9$ to $R_{12}$ is a hydrocarbon group which may bear a substituent; in the case that X is a divalent or trivalent heteroatom; $R_7$ and/or $R_8$ are absent; and $R_{15}$ to $R_{18}$ independently denote a hydrogen atom or an arbitrary substituent.

3. The organic electroluminescent device of claim 1 or 2, comprising as a guest compound the dicyanomethylenepyran or a dicyanomethylenethiopyran compound represented by General Formula 5, or a coumarin compound represented by General Formula 6:

General Formula 5:

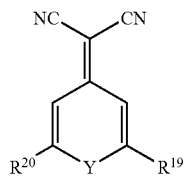

wherein in General Formula 5, Y denotes an oxygen or sulfur atoms; $R_{19}$ denotes an aminostyryl group, while $R_{20}$ denotes either another aminostyryl group or a hydrocarbon group; and an amino group of said aminostyryl group in $R_{19}$ and/or $R_{20}$ may be linked with a benzene ring in a styryl group to form a cyclic structures:

General Formula 6:

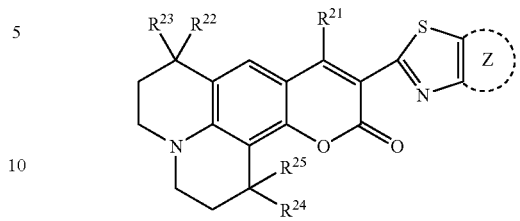

wherein in General Formula 6, $R_{21}$ denotes a hydrogen atom or a hydrocarbon group which may bear one or more substituents; $R_{22}$ to $R_{25}$ independently denote a hydrogen atom or an aliphatic hydrocarbon group, and Z denotes an aromatic ring condensed with a thiazole ring.

4. A display panel comprising the organic electroluminescent device of any one of claims 1 to 3.

5. An information displaying apparatus which contains the organic electroluminescent device of any one of claims 1 to 3.

* * * * *